US008310418B2

(12) United States Patent
Tomida et al.

(10) Patent No.: US 8,310,418 B2
(45) Date of Patent: Nov. 13, 2012

(54) SELF-LUMINOUS DISPLAY DEVICE AND DRIVING METHOD OF THE SAME INCLUDING A LIGHT EMISSION INTERRUPTION PERIOD DURING A LIGHT EMISSION ENABLED PERIOD

(75) Inventors: Masatsugu Tomida, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 921 days.

(21) Appl. No.: 12/314,039

(22) Filed: Dec. 3, 2008

(65) Prior Publication Data

US 2009/0153448 A1 Jun. 18, 2009

(30) Foreign Application Priority Data

Dec. 13, 2007 (JP) ................................ 2007-322420

(51) Int. Cl.
*G09G 3/32* (2006.01)
*G09G 3/36* (2006.01)
*G06F 3/038* (2006.01)
*H03B 1/00* (2006.01)

(52) U.S. Cl. ............ 345/82; 345/204; 345/89; 345/211; 327/112

(58) Field of Classification Search ..................... 345/82
See application file for complete search history.

(56) References Cited

U.S. PATENT DOCUMENTS

2004/0155873 A1* 8/2004 Miyazawa .................... 345/204
2005/0218946 A1* 10/2005 Miyazawa .................... 327/112
2007/0008250 A1* 1/2007 Hoppenbrouwers et al. ... 345/76
2007/0070009 A1* 3/2007 Mori et al. ...................... 345/89
2007/0152920 A1* 7/2007 Yamashita et al. .............. 345/76
2009/0128534 A1* 5/2009 Fish et al. ..................... 345/211

FOREIGN PATENT DOCUMENTS

| | | | |
|---|---|---|---|
| JP | 2002-189448 | A | 7/2002 |
| JP | 2003173165 | A * | 6/2003 |
| JP | 2004-085802 | A | 3/2004 |
| JP | 2006-215213 | | 8/2006 |
| JP | 2006-215213 | A | 8/2006 |
| JP | 2006215213 | A * | 8/2006 |
| JP | 2006-330138 | A | 12/2006 |
| JP | 2007-256958 | A | 10/2007 |
| JP | 2007-310311 | A | 11/2007 |
| JP | 2007-316163 | A | 12/2007 |
| JP | 2007-316454 | A | 12/2007 |

* cited by examiner

*Primary Examiner* — Alexander S Beck
*Assistant Examiner* — Kirk Hermann
(74) *Attorney, Agent, or Firm* — Rader, Fishman & Grauer, PLLC

(57) ABSTRACT

A self-luminous display device includes: pixel circuits; and a drive circuit, wherein each of the pixel circuits includes a light-emitting diode, a drive transistor connected to a drive current channel of the light-emitting diode, and a holding capacitor coupled to a control node of the drive transistor, the drive circuit applies a light emission enabling bias to the light-emitting diode after correcting the drive transistor and writing a data voltage to the control node, provides, during a light emission enabled period in which the light emission enabling bias is applied, a light emission interruption period adapted to change the light emission enabling bias to a non-light emission bias with the data voltage held by the holding capacitor, and performs a light emission disabling process, adapted to reverse-bias the light-emitting diode to stop the light emission, for a constant period after the light emission enabled period.

11 Claims, 14 Drawing Sheets

<LM(1)>

$$I_{ds} = \frac{1}{2}\mu\frac{W}{L}C_{ox}(V_{gs}-V_{th})^2$$

<LM0>

<LM-STOP: DISCHARGE>

<LM-STOP: Vo SAMPLING>

<START OF VTC (T16)>

<BEFORE END OF VTC (T17)>

<W&μ>

<LM(1)>

SELF-LUMINOUS DISPLAY DEVICE AND DRIVING METHOD OF THE SAME INCLUDING A LIGHT EMISSION INTERRUPTION PERIOD DURING A LIGHT EMISSION ENABLED PERIOD

CROSS REFERENCES TO RELATED APPLICATIONS

The present invention contains subject matter related to Japanese Patent Application JP 2007-322420 filed in the Japan Patent Office on Dec. 13, 2007, the entire contents of which being incorporated herein by reference.

BACKGROUND OF THE INVENTION

1. Field of the invention

The present invention relates to a self-luminous display device having, in each pixel circuit, a light-emitting diode adapted to emit light when applied with a bias voltage, a drive transistor adapted to control a drive current flowing through the light-emitting diode and a holding capacitor coupled to a control node of the drive transistor, and to a driving method of the same.

2. Description of the Related Art

An organic electro-luminescence element is known as an electro-optical element used in a self-luminous display device. This element, typically referred to as an OLED (Organic Light Emitting Diode), is a type of light-emitting diode.

The OLED has a plurality of organic thin films stacked one atop another. These thin films function, for example, as an organic hole transporting layer and organic light-emitting layer. The OLED is an electro-optical element which relies on the light emission of an organic thin film when applied with an electric field. Controlling the current level through the OLED provides color gray levels. Therefore, a display device using the OLED as an electro-optical element has, in each pixel, a pixel circuit which includes a drive transistor and capacitor. The drive transistor controls the amount of current flowing through the OLED. The capacitor holds the control voltage of the drive transistor.

Various types of pixel circuits have been proposed to date.

Chief among the proposed types of circuits are the 4T1C pixel circuit with four transistors (4T) and one capacitor (1C), 4T2C, 5T1C and 3T1C pixel circuits.

All of the above pixel circuits are designed to prevent image quality degradation resulting from the variation in transistor characteristics. The transistors are made of TFTs (Thin Film Transistor). These circuits are intended to maintain the drive current in the pixel circuit constant so long as a data voltage is constant, thus providing improved uniformity across the screen (brightness uniformity). The characteristic variation of the drive transistor, adapted to control the amount of current according to the data potential of an incoming video signal, directly affects the light emission brightness of the OLED particularly when the OLED is connected to power in the pixel circuit.

The largest of all the characteristic variations of the drive transistor is that of a threshold voltage. A gate-to-source voltage of the drive transistor must be corrected so as to cancel the effect of the threshold voltage variation of the drive transistor from the drive current. This correction will be hereinafter referred to as a "threshold voltage correction."

Further, assuming that the threshold voltage correction will be performed, further improved uniformity can be achieved if the gate-to-source voltage is corrected so as to cancel the effect of a driving capability component (typically referred to as a mobility). This component is obtained by subtracting the components causing the threshold variation and other factors from the current driving capability of the drive transistor. The correction of the driving capability component will be hereinafter referred to as a "mobility correction."

The corrections of the threshold voltage and mobility of the drive transistor are described in detail, for example, in Japanese Patent Laid-Open No. 2006-215213 (hereinafter referred to as Patent Document 1).

SUMMARY OF THE INVENTION

As described in Patent Document 1. the light-emitting diode (organic EL element) must be reverse-biased so as not to emit light during the threshold voltage and mobility corrections depending on the pixel circuit configuration. In this case, the brightness across the screen undergoes an instantaneous change from time to time when the display changes from one screen to another. This change will be hereinafter referred to as a "flashing phenomenon" because this phenomenon is particularly conspicuous in that the screen shines instantaneously bright.

The present embodiment relates to a self-luminous display device capable of preventing or suppressing the instantaneous change in brightness across the screen (flashing phenomenon) and a driving method of the same.

A self-luminous display device according to an embodiment (first embodiment) of the present invention has pixel circuits and a drive circuit. Each of the pixel circuits includes a light-emitting diode, a drive transistor connected to a drive current channel of the light-emitting diode, and a holding capacitor coupled to a control node of the drive transistor.

The drive circuit applies a light emission enabling bias to the light-emitting diode after correcting the drive transistor and writing a data voltage to the control node. The same circuit provides a light emission interruption period during a light emission enabled period in which the light emission enabling bias is applied. The light emission interruption period is adapted to change the light emission enabling bias to a non-light emission bias with the data voltage held by the holding capacitor. The drive circuit performs a light emission disabling process for a constant period after the light emission enabled period. The light emission disabling process is adapted to reverse-bias the light-emitting diode to stop the light emission.

A voltage held by the holding capacitor should preferably be initialized during the constant period in which the light emission disabling process is performed.

A self-luminous display device according to another embodiment (second embodiment) of the present invention has the following characteristic feature in addition to the characteristic features of the first embodiment.

That is, in the self-luminous display device according to the second embodiment, the period of time from the beginning of the correction to the end of the light emission disabled period in which the light emission disabling process is performed is determined as a constant screen display period. The drive circuit controls the length of the light emission enabled period during which the light-emitting diode actually emits light by changing the length of the light emission interruption period.

A self-luminous display device according to still another embodiment (third embodiment) of the present invention has the following characteristic feature in addition to the characteristic features of the first embodiment.

That is, in the drive circuit of the self-luminous display device according to the third embodiment, the drive circuit stops the light emission of the light-emitting diode by reverse-biasing the same diode during the light emission interruption period and light emission disabled period in which the light emission disabling process is performed.

A self-luminous display device according to still another embodiment (fourth embodiment) of the present invention has the following characteristic feature in addition to the characteristic features of the first embodiment.

That is, the drive circuit of the self-luminous display device according to the fourth embodiment performs a false light emission for a predetermined period at the beginning of the light emission enabled period. In the false light emission, light cannot substantially be emitted although the light emission enabling bias is applied to the light-emitting diode. The drive circuit changes the light emission enabling bias to the non-light emission bias when the light emission interruption period begins after the false light emission. Then, the drive circuit changes the non-light emission bias back to the light emission enabling bias after elapse of a predetermined period.

A self-luminous display device according to still another embodiment (fifth embodiment) of the present invention has the following characteristic feature in addition to the characteristic features of the first embodiment.

That is, the drive circuit of the self-luminous display device according to the fifth embodiment performs a false light emission for a predetermined period at the end of the light emission enabled period. In the false light emission, light cannot substantially be emitted although the light emission enabling bias is applied to the light-emitting diode. The drive circuit changes the light emission enabling bias to the non-light emission bias and initializes the held voltage when the light emission disabling process begins after the false light emission.

A self-luminous display device according to still another embodiment (sixth embodiment) of the present invention has the following characteristic feature in addition to the characteristic features of the first embodiment.

That is, the drive circuit of the self-luminous display device according to the sixth embodiment repeats a light emission enabled period, long enough for the light-emitting diode to be able to actually emit light, and the light emission interruption period a predetermined number of times during the light emission enabled period.

A driving method of a self-luminous display device according to still another embodiment (seventh embodiment) of the present invention is a driving method of a self-luminous display device which has pixel circuits and a drive circuit. Each of the pixel circuits includes a light-emitting diode, a drive transistor connected to a drive current channel of the light-emitting diode, and a holding capacitor coupled to a control node of the drive transistor. The driving method includes the following steps:

(1) Light emission disabling process step of stopping the light emission by reverse-biasing the light-emitting diode for a constant period (2) Correction and writing step of correcting the driving transistor and writing a data voltage to the control node (3) Light emission enabling bias application step of applying a light emission enabling bias to the light-emitting diode according to the written data voltage (4) Light emission interruption step of temporarily changing the light emission enabling bias to a non-light emission bias with the data voltage held by the holding capacitor halfway through the application of the light emission enabling bias Further, the light emission disabling process should preferably stop the light emission of the light-emitting diode by reverse-biasing the same diode and initialize the voltage held by the holding capacitor.

A driving method of a self-luminous display device according to still another embodiment (eighth embodiment) of the present invention has the following characteristic feature in addition to the characteristic features of the seventh embodiment.

That is, the driving method according to the eighth embodiment determines, as a constant screen display period, the correction and writing step, light emission enabling bias application step, light emission interruption step, recovery of the light emission enabling bias and light emission disabling process step in this order. Further, the driving method controls the length of the light emission enabled period during which the light-emitting diode actually emits light by changing the length of the light emission interruption period in the light emission enabling bias application step, light emission interruption step and recovery of the light emission enabling bias.

Incidentally, the inventors et al., of the present embodiment have found from the analysis of the causes of the "flashing phenomenon" mentioned earlier that this phenomenon is related to the length of the reverse-biasing period of the light-emitting diode (e.g., organic EL element). With regards to the reverse-biasing of an organic EL element, Patent Document 1 describes control which performs a threshold voltage correction with the organic light-emitting diode OLED (organic EL element) reverse-biased in a 5T1C pixel circuit (refer to the first and second embodiments of Patent Document 1 and to, for example, paragraph 0046 of the first embodiment). Although not described in Patent Document 1 because of its focus only on the driving of a single pixel, the reverse bias of an organic EL element begins from the end of light emission in the previous screen display period (1F) and is cancelled at the next light emission following a correction period in a practical organic EL display. Therefore, the length (beginning) of the reverse-biasing is dependent upon the length of the light emission enabled period of the organic EL element and changes from time to time.

An organic EL element undergoes degradation in its characteristics due to a secular change in the event of an excessive increase in amount of current flowing therethrough. This characteristic degradation can be compensated for (corrected) to a certain extent by the threshold voltage and mobility corrections mentioned earlier. However, complete correction of an excessive degradation is impossible. Therefore, the smaller the characteristic degradation, the better. As a result, in order to increase the light emission brightness, the light emission enabled period may be extended (the pulse duty ratio may be controlled) rather than increasing the amount of drive current.

Further, if the surrounding environment of the screen is bright, the light emission enabled period may be extended to make the screen easier to view in consideration of the aforementioned limitations of the corrections. Still further, when the brightness is reduced in line with the demand for lower power consumption, the light emission time may be reduced rather than reducing the amount of drive current.

A "flashing phenomenon" is observed during screen change when the screen brightness is changed by changing the average pixel light emission brightness. Therefore, the "flashing phenomenon" manifests itself differently depending on the length of the reverse-biasing period. From this point of view, the inventors et al., of the present embodiment have concluded that the equivalent capacitance of the light-emitting diode (e.g., organic EL element) changes over time when the same diode is reverse-biased and that this change affects the correction accuracy and eventually changes the brightness across the screen.

Hence, in the aforementioned first to eighth embodiments of the present invention, the light emission interruption period is provided halfway through the light emission enabled period in which the light emission enabling bias is applied to the light-emitting diode. During the light emission interruption period, the light emission enabling bias is temporarily changed to the non-light emission bias. According to the third embodiment, the non-light emission bias reverse-biases the light-emitting diode. It should be noted, however, that the temporary application of a reverse bias during the light emission enabled period is conducted with the data voltage held by the holding capacitor. Therefore, the light-emitting diode is readily restored to the initial light emission enabling bias when the application of a reverse bias is cancelled. This can be taken advantage of to set the non-light emission biasing period (light emission interruption period) as desired.

In the first to eighth embodiments, the light emission disabling process performed immediately after the light emission enabled period and in which a reverse bias is applied is set to a constant length.

If the light emission disabling process is set to a constant length in the absence of the light emission interruption period, the length of the light emission enabled period is fixed and cannot be changed.

Therefore, the first to eighth embodiments allow for the length of the light emission enabled period to be controlled by changing the length of the light emission interruption period. That is, the length of the light emission enabled period during which the light-emitting diode actually emits light can be readily controlled by changing the length of the light emission interruption period as is done in the second embodiment.

According to the more specific fourth and fifth embodiments, a false light emission is set at the beginning or end of the light emission enabled period. In the false light emission, the light-emitting diode cannot actually emit light although the light emission enabling bias is applied to the light-emitting diode.

According to the another specific sixth embodiment, the light emission enabled period, long enough for the light-emitting diode to actually emit light, and the light emission interruption period are repeated a predetermined number of times during the light emission enabled period. At this time, the length of the light emission interruption period and number of times the same period is inserted should be determined so that the total length of the light emission enabled period matches the desired length.

The above setting of the light emission interruption period is intended to ensure that a reverse bias application time remains constant at all times during the light emission disabling process immediately before the threshold voltage correction. So long as the reverse bias application time immediately before the threshold voltage correction is constant, the control nodes of the light-emitting diodes of the different pixel circuits have roughly the same bias voltage for the same data voltage input after the threshold voltage or mobility correction. That is, the above setting eliminates the error component contained in the bias voltage to be applied to the light-emitting diode before the light emission, as a result of the difference in reverse bias application time. This ensures improved correction accuracy, providing roughly constant light emission intensity between different pixels for the same data voltage input.

The present embodiment provides an effectively constant reverse bias application time immediately before the threshold voltage or mobility correction, thus ensuring roughly constant light emission intensity between different pixels for the same data voltage input and effectively preventing or suppressing a so-called flashing phenomenon.

DETAILED DESCRIPTION OF THE PREFERRED EMBODIMENTS

The preferred embodiments of the present invention will be described below taking, as an example, an organic EL display having 2T1C pixel circuits with reference to the accompanying drawings.

<<First Embodiment>>

In the first embodiment, a description will be given of a configuration common to more detailed second to fourth embodiments, which will be described later, and a basic concept of light emission time control common to all the embodiments.

<Overall Configuration>

Figure 1:
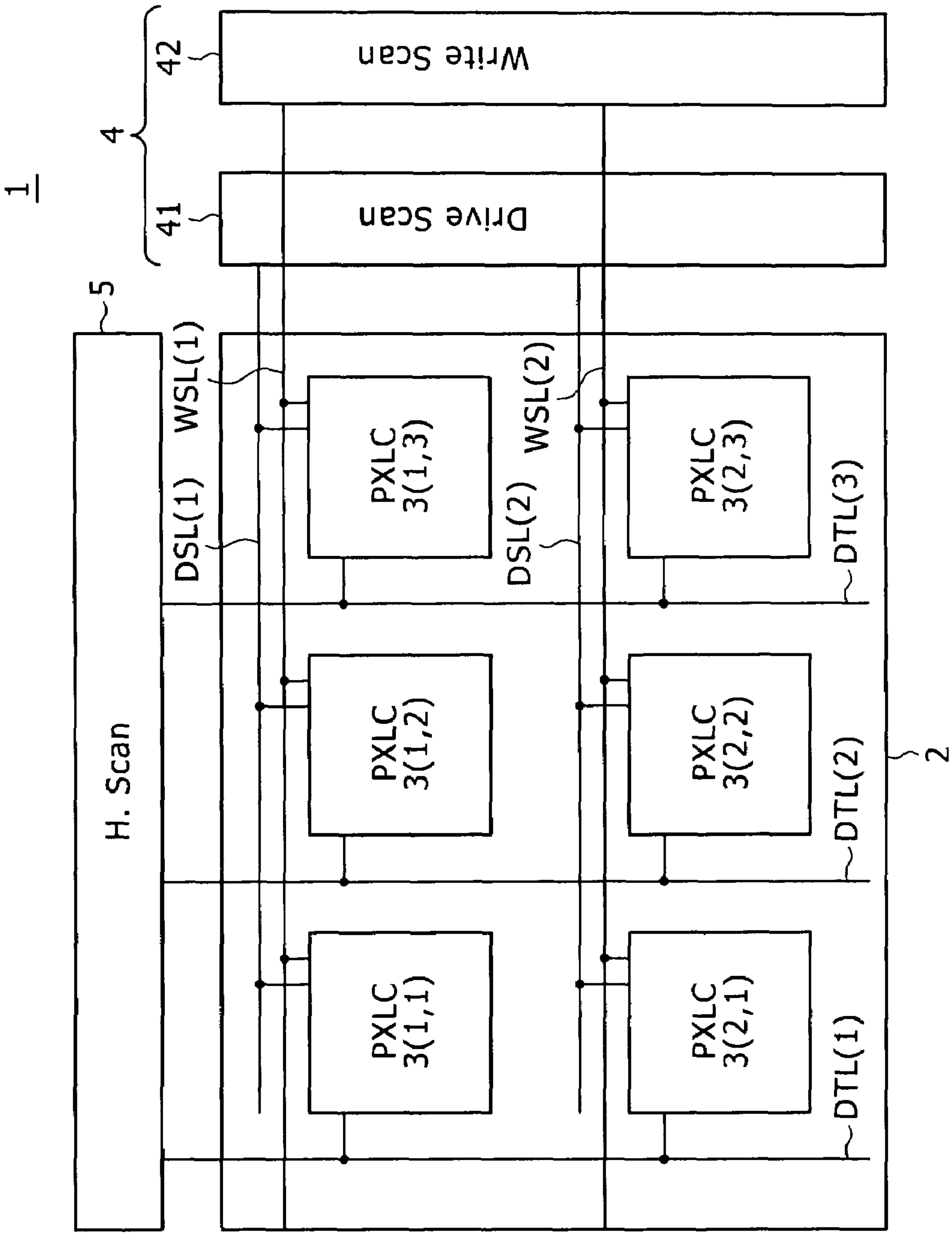
FIG. 1 is a block diagram illustrating an example of major components of an organic EL display according to embodiments of the present invention.

FIG. 1 illustrates an example of major components of an organic EL display according to the embodiments of the present invention.

An organic EL display 1 illustrated in FIG. 1 includes a pixel array 2. The pixel array 2 has a plurality of pixel circuits (PXLC) 3(*i, j*) arranged in a matrix form. The organic EL display 1 further includes vertical drive circuits (V. scanners) 4 and horizontal drive circuit (H. selector: HSEL) adapted to drive the pixel array 2.

The plurality of V. scanners 4 are provided according to the configuration of the pixel circuits 3. Here, the V. scanners include a horizontal pixel line drive circuit (Drive Scan) 41 and write signal scan circuit (Write Scan) 42. The V. scanners 4 and H. selector 5 are part of a "drive circuit." The "drive circuit" includes, in addition to the V. scanners 4 and H. selector 5, a circuit adapted to supply clock signals to the V. scanners 4 and H. selector 5, control circuit (e.g., CPU) and other unshown circuits.

Reference numerals 3(*i, j*) of the pixel circuits shown in FIG. 1 mean that each of the circuits has a vertical address i (i=1 or 2) and horizontal address j (j=1, 2 or 3). These addresses 'i' and 'j' take on an integer value of 1 or larger, with their maximum values being 'n' and 'm' respectively. Here, a case is shown in which n=2 and m=3 for simplification of the drawing.

This address notation is applied to the elements, signals, signal lines and voltages in the pixel circuit in the description and drawings given hereinafter.

Pixel circuits 3(1, 1) and 3(2, 1) are connected to a video signal line DTL(1) running in the vertical direction. Similarly, pixel circuits 3(1, 2) and 3(2, 2) are connected to a video signal line DTL(2) running in the vertical direction. Pixel circuits 3(1, 3) and 3(2, 3) are connected to a video signal line DTL(3) running in the vertical direction. The video signal lines DTL(1) to DTL(3) are driven by the H. selector 5.

The pixel circuits 3(1, 1), 3(1, 2) and 3(1, 3) in the first row are connected to a write scan line WSL(1). Similarly, the pixel circuits 3(2, 1), 3(2, 2) and 3(2, 3) in the second row are connected to a write scan line WSL(2). The write scan lines WSL(1) and WSL(2) are driven by the write signal scan circuit 42.

Further, the pixel circuits 3(1, 1), 3(1, 2) and 3(1, 3) in the first row are connected to a power scan line DSL(1). Similarly, the pixel circuits 3(2, 1), 3(2, 2) and 3(2, 3) in the second row are connected to a power scan line DSL(2). The power scan lines DSL(1) and DSL(2) are driven by the horizontal pixel line drive circuit 41.

Any one of m video signal lines including the video signal lines DTL(1) to DTL(3) will be hereinafter expressed by reference numeral DTL(j). Similarly, any one of n write scan lines including the write scan lines WSL(1) and WSL(2) will be expressed by reference numeral WSL(i), and any one of n power scan lines including the power scan lines DSL(1) and DSL(2) by reference numeral DSL(i).

Either the line sequential driving or dot sequential driving may be used in the present embodiment. In the line sequential driving, a video signal is supplied simultaneously to all the video signal lines DTL(j) in a display pixel row (also referred to as display lines). In the dot sequential driving, a video signal is supplied to the video signal lines DTL(j), one after another.

<Pixel Circuits>

Figure 2:
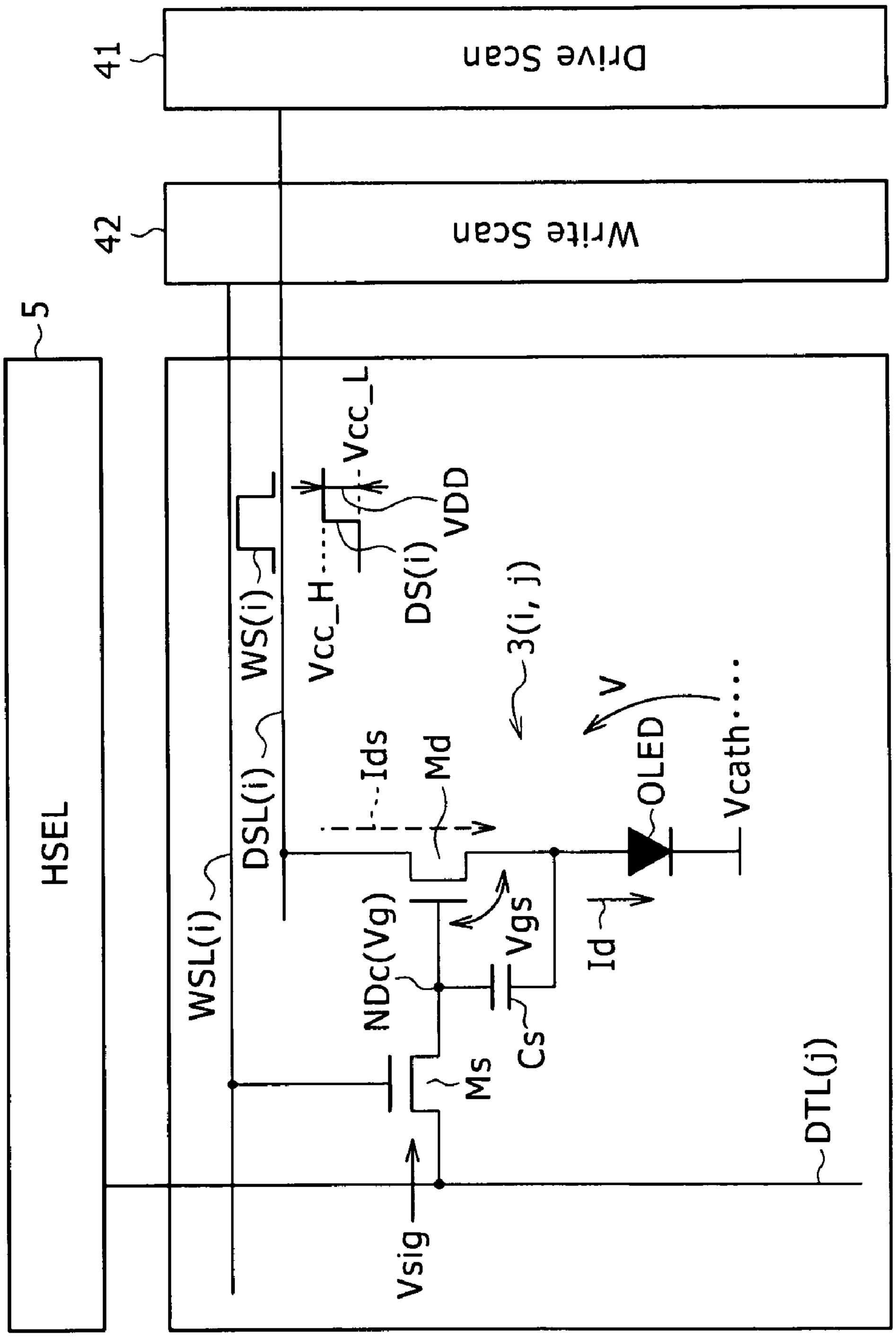
FIG. 2 is a block diagram including the basic configuration of a pixel circuit according to the embodiments of the present invention.

A configuration example of the pixel circuit 3(*i,j*) is illustrated in FIG. 2.

The pixel circuit 3(*i, j*) illustrated in FIG. 2 controls an organic light-emitting diode OLED. The pixel circuit includes a drive transistor Md, sampling transistor Ms and holding capacitor Cs, in addition to the organic light-emitting diode OLED. The drive transistor Md and sampling transistor Ms each include an NMOS TFT.

In the case of a top emission display, the organic light-emitting diode OLED is formed as follows although the configuration thereof is not specifically illustrated. First, an anode electrode is formed over a TFT structure which is formed on a substrate, made, for example, of transparent glass. Next, a layered body which makes up an organic multilayer film is formed on the anode electrode by sequentially stacking a hole transporting layer, light-emitting layer, electron transporting layer and electron injection layer and other layers. Finally, a cathode electrode which includes a transparent electrode material is formed on the layered body. The anode electrode is connected to a positive power supply, and the cathode electrode to a negative power supply.

If a bias voltage adapted to produce a predetermined electric field is applied between the anode and cathode electrodes of the organic light-emitting diode OLED, the organic multilayer film emits light when the injected electrons and holes recombine in the light-emitting layer. The organic light-emitting diode OLED can emit any of red (R), green (G) and blue (B) lights if the organic substance making up the organic multilayer film is selected as appropriate. Therefore, the display of color image can be achieved by arranging the pixels in each row so that each pixel can emit RGB lights. Alternatively, the distinction between R, G and B may be made by filter colors by using a white light-emitting organic substance. Still alternatively, four colors, namely, R, G, B and W (white), may be used instead.

The drive transistor Md functions as a current control section adapted to control the amount of current flowing through the organic light-emitting diode OLED so as to determine the display gray level.

The drive transistor Md has its drain connected to the power scan line DSL(i) adapted to control the supply of a source voltage VDD. The same transistor Md has its source connected to the anode of the organic light-emitting diode OLED.

The sampling transistor Ms is connected between a supply line (video signal line DTL(j)) of a data potential Vsig and the gate (control node NDc) of the drive transistor Md. The data potential Vsig determines the pixel gray level. The same transistor Ms has one of its source and drain connected to the gate (control node NDc) of the drive transistor Md and the other thereof connected to the video signal line DTL(j). A data pulse having the data potential Vsig is supplied to the video signal line DTL(j) from the H. selector 5 (refer to FIG. 1) at predetermined intervals. The sampling transistor Ms samples the data having the level to be displayed by the pixel circuit at a proper timing during this data potential supply period (data pulse duration time). This is done to eliminate the adverse impact of unstable level during the transition period on the display image. The level is unstable in the front and rear edges of the data pulse which has the desired data potential vsig to be sampled.

The holding capacitor Cs is connected between the gate and source (anode of the organic light-emitting diode OLED) of the drive transistor Md. The roles of the holding capacitor Cs will be clarified in the description of the operation which will be given later.

In FIG. 2, a power drive pulse DS(i) is supplied to the drain of the drive transistor Md by the horizontal pixel line drive circuit 41. The power drive pulse DS(i) has a high potential Vcc_H and a reference or low potential Vcc_L with a peak voltage equal to the source voltage VDD. Power is supplied during the correction of the drive transistor Md and the light emission of the organic light-emitting diode OLED.

Further, a write drive pulse WS(i) having a relatively short duration time is supplied to the gate of the sampling transistor Ms from the write signal scan circuit 42, thus allowing for the sampling to be controlled.

It should be noted that the supply of power may be alternatively controlled by inserting another transistor between the drain of the drive transistor Md and the supply line of the source voltage VDD and controlling the gate of the inserted transistor by means of the horizontal pixel line drive circuit 41 (refer to the modification example which will be described later).

In FIG. 2, the organic light-emitting diode OLED has its anode supplied with the source voltage VDD from a positive power supply via the drive transistor Md and its cathode connected to a predetermined power line (negative power line) adapted to supply a cathode potential Vcath.

All transistors in the pixel circuit are normally formed by TFTs. The thin film semiconductor layer used to form the TFT channels is made of a semiconductor material including polysilicon or amorphous silicon. Polysilicon TFTs can have a high mobility but vary significantly in their characteristics, which makes these TFTs unfit for use in a large-screen display device. Therefore, amorphous TFTs are typically used in a display device having a large screen. It should be noted, however, that P-channel TFTs are difficult to form with amorphous silicon TFTs. As a result, N-channel TFTs should preferably be used for all the TFTs as in the pixel circuit 3(*i, j*).

Here, the pixel circuit 3(*i, j*) is an example of a pixel circuit applicable to the present embodiment, namely, an example of basic configuration of a 2T1C pixel circuit with two transistors (2T) and one capacitor (1C). Therefore, the pixel circuit which can be used in the present embodiment may have additional transistor and/or capacitor in addition to the basic configuration of the pixel circuit 3(*i, j*) (refer to the modification examples given later). In some pixel circuits having the basic configuration, the holding capacitor Cs is connected between the supply line of the source voltage VDD and the gate of the drive transistor Md.

More specifically, several pixel circuits other than the 2T1C pixel circuit will be described briefly in the modification examples given later. Such circuits may be any of 4T1C, 4T2C, 5T1C and 3T1C pixel circuits.

In the pixel circuit configured as shown in FIG. 2, reverse-biasing the organic light-emitting diode OLED during the threshold voltage or mobility correction provides an equivalent capacitance sufficiently greater than the capacitance of the holding capacitor Cs. As a result, the anode of the same diode OLED is potentially roughly fixed, thus ensuring improved correction accuracy. Therefore, the corrections should preferably be performed with the same diode OLED reverse-biased.

The cathode is connected to a predetermined voltage line rather than to ground (grounding the cathode potential Vcath) to reverse-bias the organic light-emitting diode OLED. The cathode potential Vcath is increased greater than the reference potential (low potential Vcc_L) of the power drive pulse DS(i), for example, to reverse-bias the same diode OLED.

<Display Control>

The operation of the circuit shown in FIG. 2 during data write will be described together with the threshold voltage and mobility correction operations. This series of operations will be referred to as "display control."

A description will be given first of the characteristics of the drive transistor which will be corrected and those of the organic light-emitting diode OLED.

The holding capacitor Cs is coupled to the control node NDc of the drive transistor Md shown in FIG. 2. The data potential Vsig of the data pulse transmitted through the video signal DTL(j) is sampled by the sampling transistor Ms. The obtained data potential is applied to the control node NDc and held by the holding capacitor Cs. When the predetermined data potential is applied to the gate of the drive transistor Md, a drain current Ids of the same transistor Md is determined by a gate-to-source voltage Vgs whose level is commensurate with the applied potential.

Here, a source potential Vs of the drive transistor Md is initialized to the reference potential (reference data potential Vo) of the data pulse before the sampling. The drain current Ids flows through the drive transistor Md. The same current Ids is commensurate with the magnitude of a data potential Vin which is determined by the post-sampling data potential Vsig, and more precisely, by the potential difference between the reference data potential Vo and data potential Vsig. The drain current Ids serves roughly as a drive current Id of the organic light-emitting diode OLED.

Hence, when the source potential Vs of the drive transistor Md is initialized to the reference data potential Vo, the organic light-emitting diode OLED will emit light at the brightness commensurate with the data potential Vsig.

Figure 3:
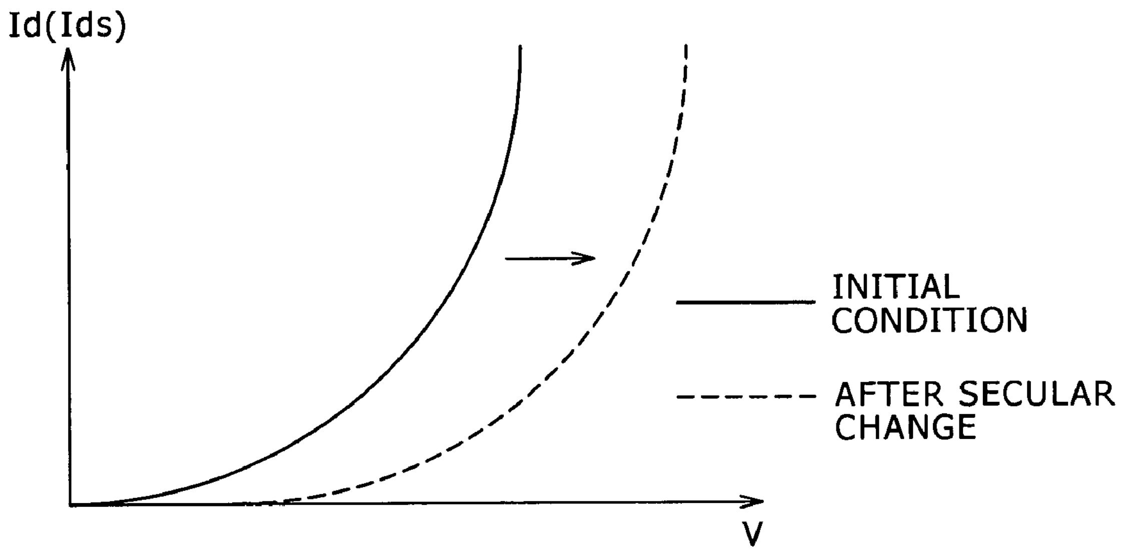
FIG. 3 is a diagram illustrating a graph and equation showing the characteristics of an organic light-emitting diode.

FIG. 3 illustrates an I-V characteristic graph of the organic light-emitting diode OLED and a typical equation for the drain current Ids of the drive transistor Md (roughly corresponds to the drive current Id of the organic light-emitting diode OLED).

The I-V characteristic of the organic light-emitting diode OLED changes as illustrated in FIG. 3 due to secular change. At this time, despite the attempt of the drive transistor Md in the pixel circuit shown in FIG. 2 to pass the constant drain current Ids, the source voltage Vs of the organic light-emitting diode OLED will rise as is clear from the graph of FIG. 3 because of the increase in the voltage applied to the same diode OLED. At this time, the gate of the drive transistor Md is floating. Therefore, the gate potential will increase with the increase of the source potential to maintain the gate-to-source voltage Vgs roughly constant. This acts to maintain the light emission brightness of the organic light-emitting diode OLED unchanged.

However, a threshold voltage Vth and mobility μ of the drive transistor Md are different between different pixel circuits. This leads to a variation in the drain current Ids according to the equation in FIG. 3. As a result, the light emission brightness is different between two pixels in the display screen even if the two pixels are supplied with the same data potential Vsig.

In the equation shown in FIG. 3, reference numeral Ids represents the current flowing from the drain to source of the drive transistor Md operating in the saturation region. Further, in the drive transistor Md, reference numeral Vth represents the threshold voltage, μ the mobility, W the effective channel width (effective gate width), and L the effective channel length (effective gate length). Still further, reference numeral Cox represents the unit gate capacitance of the drive transistor Md, namely, the sum of the gate oxide film capacitance per unit area and the fringing capacitance between the source/drain and gate.

The pixel circuit having the N-channel drive transistor Md is advantageous in that it offers high driving capability and permits simplification of the manufacturing process. To suppress the variation in the threshold voltage Vth and mobility μ, however, the threshold voltage Vth and mobility μ must be corrected before setting a light emission enabling bias.

FIGS. 4A to 4E are timing diagrams illustrating the waveforms of various signals and voltages during display control. In this display control, data is sequentially written on a row-by-row basis. FIGS. 4A to 4E illustrate a case in which data is written to the pixel circuits 3(1,*j*) in the first row (display line) and the display control is performed on the first row or display line in a field F(1). It should be noted that FIGS. 4A to 4E illustrate part of the control (light emission disabling process) performed in a previous field F(0).

Figures 4A, 4B, 4C, 4D, 4E:
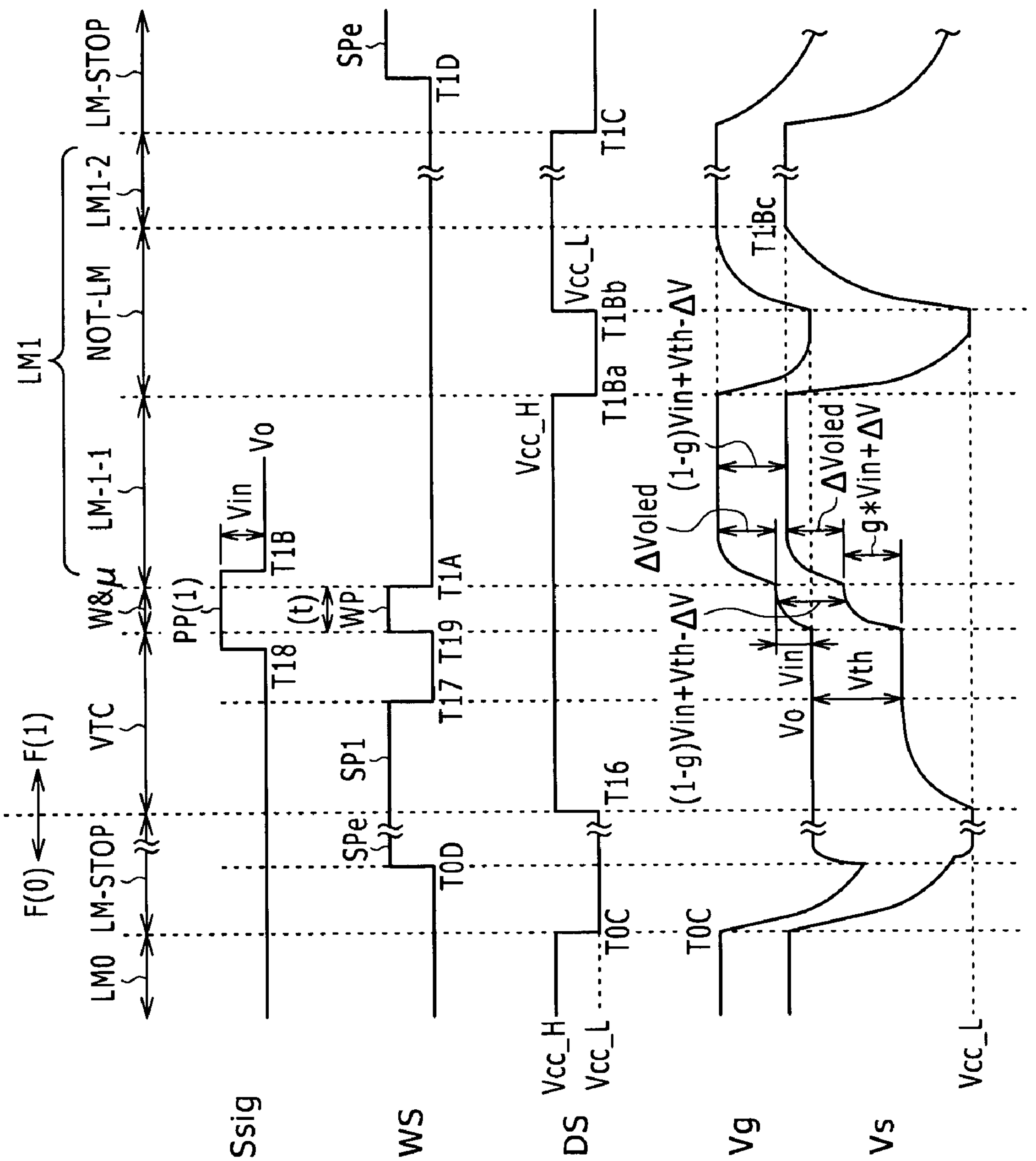
FIGS. 4A to 4E are timing diagrams illustrating the waveforms of various signals and voltages during display control according to the embodiments of the present invention.

FIG. 4A is a waveform diagram of a video signal Ssig. FIG. 4B is a waveform diagram of a write drive pulse WS supplied to the display line to which data is to be written. FIG. 4C is a waveform diagram of a power drive pulse DS supplied to the display line to which data is to be written. FIG. 4D is a waveform diagram of the gate voltage Vg (control node NDc) of the drive transistor Md in the pixel circuit 3(1, *j*) which belongs to the display line to which data is to be written. FIG. 4E is a waveform diagram of the source voltage Vs of the drive transistor Md (anode potential of the organic light-emitting diode OLED) in the pixel circuit 3(1, *j*) which belongs to the display line to which data is to be written.

[Definitions of the Periods]

As illustrated at the top of FIG. 4A, the light emission enabled period (LM0) for the screen preceding by one field (or frame) is followed by the light emission disabling process period (LM-STOP) for the preceding screen. The processes for the next screen begin from here, namely in chronological order, threshold voltage correction period (VTC), writing and mobility correction period (W&μ), light emission enabled period (LM1) and light emission disabling process period (LM-STOP).

[Outline of the Drive Pulse]

In FIGS. 4A to 4E, times are indicated where appropriate by reference numerals T0C, T0D, T16, T17, T18, T19, T1A, T1B, T1Ba to T1Bc, T1C and T1D. The times T0C and T0D are associated with the field F(0). The times T16 to T1D are associated with the field F(1).

As illustrated in FIG. 4B, the write drive pulse WS contains a predetermined number of sampling pulses SP1 and SPe which are inactive at low level and active at high level. No sampling pulses appear between the sampling pulses SP1 and SPe. Of the two sampling pulses, only the sampling pulse SP1 is superimposed with a write pulse WP which appears later. As described above, the write drive pulse WS includes the sampling pulses SP1 and SPe and write pulse WP.

The video signal Ssig is supplied to the m (several hundred to one thousand and several hundred) video signal lines DTL (j) (refer to FIGS. 1 and 2). The same signal Ssig is supplied simultaneously to the m video signal lines DTL(j) in line sequential display. In FIG. 4B, only a video signal pulse PP(1) is shown. This pulse is essential to display an image in the pixels in the first row. The peak potential of the video signal pulse PP(1) from the reference data potential Vo corresponds to the gray level to be displayed (written) through the display control, i.e., the data potential Vin. This gray level (=Vin) may be the same between the pixels in the first row (in monochrome mode). Typically, however, this gray level is different according to the gray level of the display pixel row.

FIGS. 4A to 4E are intended primarily to describe the operation of a single pixel in the first row. However, the driving of other pixels in the same row is in itself controlled in parallel with and with a time shift from the driving of the single pixel illustrated in FIGS. 4A to 4E except that the display gray level may be different between the pixels.

The power drive pulse DS supplied to the drain of the drive transistor Md (refer to FIG. 2) is maintained at inactive low level, i.e., low potential Vcc_L, during the light emission disabling process period (LM-STOP from time T0C to T16) and the light emission interruption period (NOT-LM) halfway through the light emission enabled period (LM1). The power drive pulse DS is maintained at active high level, i.e., the high potential Vcc_H during any other period.

[Basic Concept of the Light Emission Time Control]

The light emission control in the present embodiment is related to providing the light emission interruption period (NOT-LM) halfway through the light emission enabled period (LM1 in FIG. 4), for example, by controlling the power drive pulse DS.

During the light emission enabled period, the write drive pulse WS is maintained at inactive low level. Therefore, the sampling transistor Ms remains off. At this time, the gate (control node NDc) of the drive transistor Md is left floating. Therefore, even if the bias (hereinafter light emission enabling bias) applied to the organic light-emitting diode OLED is changed to the non-light emission bias from the beginning (time T1A) of the light emission enabled period (LM1), for example, by deactivating the power drive pulse DS, the bias will be automatically restored to the light emission enabling bias when the non-light emission bias is cancelled.

The present embodiment is designed to control the effective light emission enabled period by controlling the length of the light emission interruption period (NOT-LM) (slightly longer than the inactive period of the power drive pulse DS) by means of the automatic bias recovery capability. The effective light emission enabled period is a period of time during which the organic light-emitting diode OLED emits light.

The light emission interruption period (NOT-LM) during the light emission enabled period (LM1) need only begin later than time T1A. That is, the light emission interruption period (NOT-LM) may begin before the organic light-emitting diode OLED actually starts to emit light. The second to fourth embodiments are related to specific start timings of the light emission interruption period (NOT-LM).

It should be noted that, although not specifically illustrated, the write drive pulse WS and power drive pulse DS are applied sequentially to the second row (pixels 3(2, *j*) in the second row) and third row (pixels 3(3, *j*) in the third row), for example, with a delay of one horizontal interval.

Hence, while the "threshold voltage correction" and "writing and mobility correction" are performed on a certain row, an "initialization" is performed on the previous row. As a result, as far as the "threshold voltage correction" and "writing and mobility correction" are concerned, these processes are conducted in a seamless manner on a row-by-row basis. This produces no useless period.

A description will be given next of the changes in the source and gate potentials of the drive transistor Md shown in FIGS. 4D and 4E and the operation resulting from these changes for each of the periods shown in FIG. 4A.

It should be noted that the explanatory diagrams of operation of the pixel 3(1, *j*) in the first row shown in FIGS. 5 to 7 will be referred to along with FIG. 2.

[Light Emission Enabled Period for the Previous Screen (LM0)]

For the pixel 3(1, *j*) in the first row, the write drive pulse WS is at low level as illustrated in FIG. 4B during the light emission enabled period (LM0) for the field F(0) (previous screen) earlier than time T0C. As a result, the sampling transistor Ms is off. At this time, on the other hand, the power drive pulse DS is at the high potential Vcc_H as illustrated in FIG. 4C.

Figure 5A:
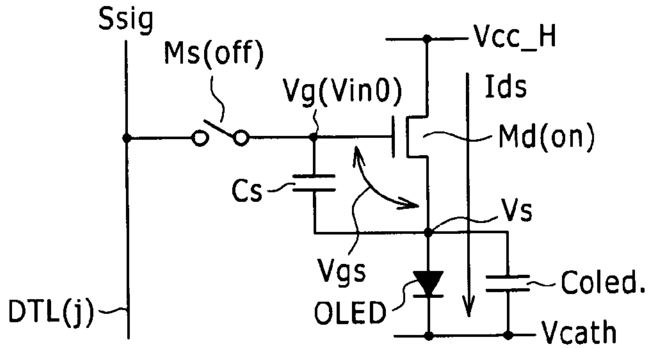
FIGS. 5A to 5C are explanatory diagrams of operation up to a light emission disabled period.

As illustrated in FIG. 5A, a data voltage Vin0 is supplied to and maintained by the gate of the drive transistor Md by means of the data write operation for the previous screen. We assume that the organic light-emitting diode OLED emits light at this time at the brightness commensurate with the data voltage Vin0. The drive transistor Md is designed to operate in the saturation region. Therefore, the drive current Id (=Ids)

flowing through the organic light-emitting diode OLED takes on the value calculated by the equation shown in FIG. 3 according to the gate-to-source voltage Vgs of the drive transistor Md held by the holding capacitor Cs.

[Light Emission Disabling Process Period (LM-STOP)]

The light emission disabling process begins at time T0C shown in FIGS. 4A to 4E.

At time T0C, the horizontal pixel line drive circuit 41 (refer to FIG. 2) changes the power drive pulse DS from the high potential Vcc_H to the low potential Vcc_C as illustrated in FIG. 4C. In the drive transistor Md, the potential of the node which has been functioning as the drain is sharply pulled down to the low potential Vcc_C. As a result, the relationship in potential between the source and drain is reversed. Therefore, the node which has been functioning as the drain serves as the source, and the node which has been functioning as the source as the drain to discharge the charge from the drain (reference numeral Vs remains unchanged as the source potential in FIGS. 5).

Figure 5B:
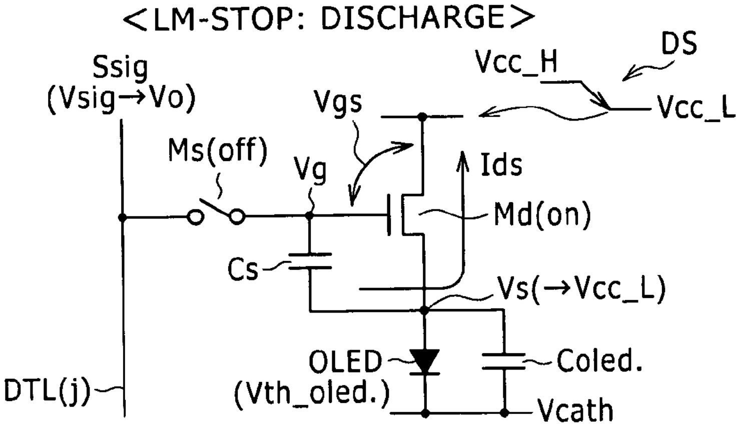

Therefore, the drain current Ids flowing in reverse direction to the previous one flows through the drive transistor Md as illustrated in FIG. 5B.

When the light emission disabling process period (LM-STOP) begins, the source (drain in the practical operation) of the drive transistor Md discharges sharply from time T0C as illustrated in FIG. 4E, causing the source potential Vs to decline close to the low potential Vcc_L. Because the gate of the sampling transistor Ms is floating, the gate potential Vg will decline with the decline of the source potential Vs.

At this time, if the low potential Vcc_L is smaller than the sum of a light emission threshold voltage Vth_oled. of the organic light-emitting diode OLED and the cathode potential Vcath, i.e., Vcc_L<Vth_oled.+Vcath, then the organic light-emitting diode OLED will stop emitting light.

Next, the write signal scan circuit 42 (refer to FIG. 2) changes the potential of the write scan line WSL(1) from low to high level at time T0D and supplies the produced sampling pulse SPe to the gate of the sampling transistor Ms.

By time T0D, the potential of the video signal Ssig is changed to the reference data potential Vo. Therefore, the sampling transistor Ms samples the reference data potential Vo of the video signal Ssig to transmit the post-sampling reference data potential Vo to the gate of the drive transistor Md.

This sampling operation causes the gate potential Vg to converge to the reference data potential Vo and as a result causes the source potential Vs to converge to the low potential Vcc_L as illustrated in FIGS. 4D and 4E.

Here, the reference data potential Vo is a predetermined potential lower than the high potential Vcc_H of the power drive pulse DS and higher than the low potential Vcc_L thereof.

This sampling operation serves also as the initialization of the voltage held by the holding capacitor Cs adapted to tune the initial condition of the correction operation.

Figure 5C:
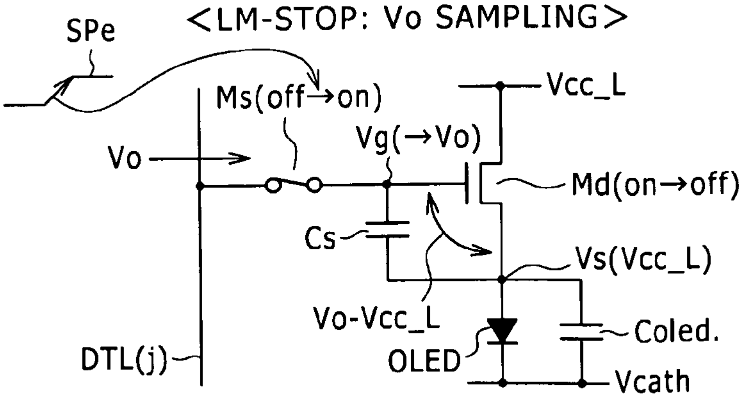

In the initialization of the held voltage, the low potential Vcc_L of the power drive pulse DS is set so that the gate-to-source voltage Vgs of the drive transistor Md (=held voltage) is greater than the threshold voltage Vth of the same transistor Md. More specifically, when the gate potential Vg is pulled to the reference data potential Vo as illustrated in FIG. 5C, the source potential Vs will be equal to the low potential Vcc_L of the power drive pulse DS, causing the voltage held by the holding capacitor Cs to drop to the value of Vo−Vcc_L. This held voltage Vo−Vcc_L is none other than the gate-to-source voltage Vgs. Unless the same voltage Vgs is greater than the threshold voltage Vth of the drive transistor Md, the threshold voltage correction operation cannot be performed later. As a result, the potential relationship is established so that Vo−Vcc_L>Vth.

Although described in detail later, the organic light-emitting diode OLED is reverse-biased and stops emitting light in the light emission disabling process period (LM-STOP).

The last sampling pulse SPe shown in FIG. 4B ends in a sufficient amount of time after time T0D, causing the sampling transistor Ms to turn off temporarily.

Later, the processes for the field F(1) will begin at time T16.

[Threshold Correction Period (VTC)]

At time T16, the first sampling pulse SP1 is at high level with the sampling transistor turned on. In this condition, the potential of the power drive pulse DS changes from the low potential Vcc_L to the high potential Vcc_H at time T16, initiating the threshold correction period (VTC).

Figure 6A:
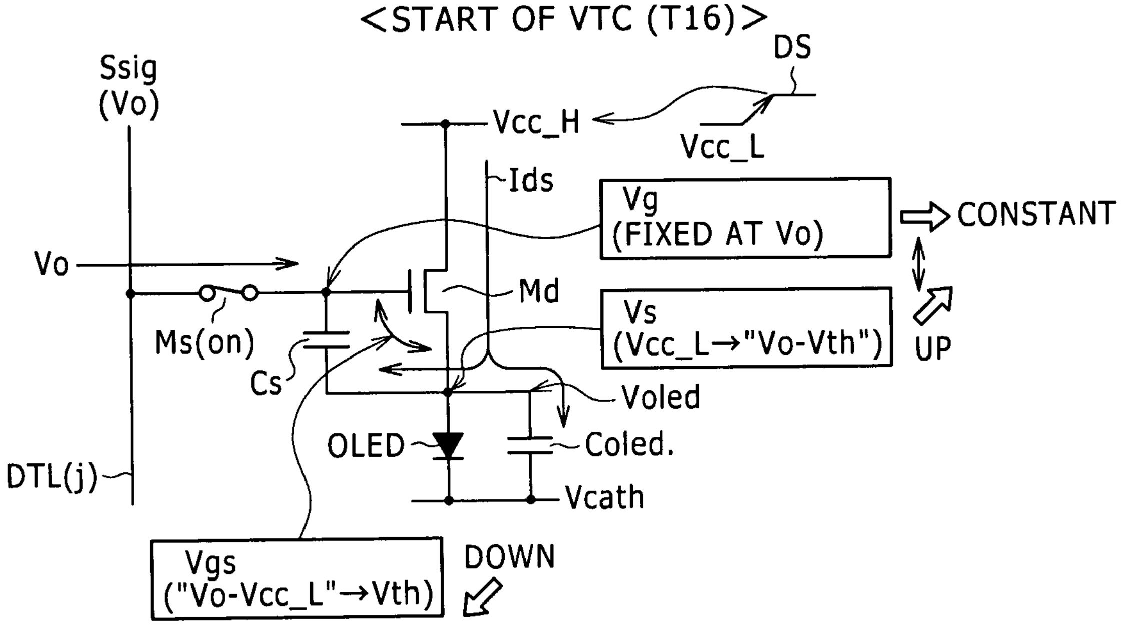
FIGS. 6A and 6B are explanatory diagrams of operation until before the end of a threshold voltage correction.

Immediately before the threshold correction period (VTC) begins (time T16), the sampling transistor Ms which is on is sampling the reference data potential Vo. Therefore, the gate potential Vg of the drive transistor Md is electrically fixed at the constant reference data potential Vo as illustrated in FIG. 6A.

In this condition, when the potential of the power drive pulse DS changes from the low potential Vcc_L to the high potential Vcc_H at time T16, the source voltage VDD corresponding to the peak value of the power drive pulse DS is applied between the source and drain of the drive transistor Md. This turns on the drive transistor Md, causing the drain current Ids to flow through the same transistor Md.

The drain current Ids charges the source of the drive transistor Md, causing the source potential Vs of the same transistor Md to rise as illustrated in FIG. 4E. Therefore, the gate-to-source voltage Vgs of the drive transistor Md (voltage held by the holding capacitor Cs) which has taken on the value of Vo−Vcc_L up to that time declines gradually (refer to FIG. 6A).

If the gate-to-source voltage Vgs declines rapidly, the increase of the source potential Vs will saturate within the threshold correction period (VTC) as illustrated in FIG. 4E. This saturation occurs because the drive transistor Md goes into cutoff as a result of the increase of the source potential. Therefore, the gate-to-source voltage Vgs (voltage held by the holding capacitor Cs) converges to the value roughly equal to the threshold voltage Vth of the drive transistor Md.

It should be noted that, in the operation shown in FIG. 6A, the drain current Ids charges not only one of the electrodes of the holding capacitor Cs but also a capacitance Coled. of the organic light-emitting diode OLED. At this time, assuming that the capacitance Coled. of the organic light-emitting diode OLED is sufficiently larger than the capacitance of the holding capacitor Cs, nearly all of the drain current Ids will be used to charge the holding capacitor Cs. In this case, the gate-to-source voltage Vgs converges roughly to the same value as the threshold voltage Vth.

To ensure accuracy in the threshold voltage correction, the organic light-emitting diode OLED is reverse-biased in advance before initiating the correction operation so as to increase the capacitance Coled. to a sufficiently large extent.

Figure 6B:
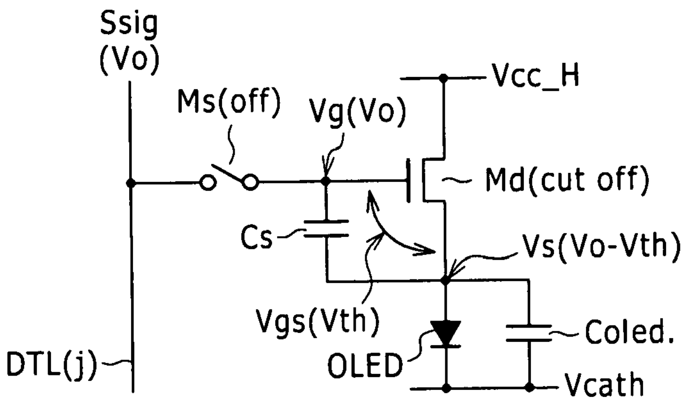

The threshold correction period (VTC) ends at time T19. However, the write drive pulse WS is deactivated at time T17 prior to time T19, causing the sampling pulse SP1 to end. This turns off the sampling transistor Ms as illustrated in FIG. 6B, causing the gate of the drive transistor Md to float. At this time, the gate potential Vg is maintained at the reference data potential Vo.

At time T18 following time T17 and prior to time T19, the video signal pulse PP(1) must be applied, that is, the potential of the video signal Ssig must be changed to the data potential Vsig. This is done to wait for the data potential Vsig to stabilize so that the data potential Vin can be written with the data potential Vsig maintained at a predetermined level during the data sampling at time T19. Therefore, the period from time T18 to time T19 is set long enough for the stabilization of the data potential.

[Effect of the Threshold Voltage Correction]

Assuming here that the gate-to-source voltage of the drive transistor increases by Vin, the gate-to-source voltage will be Vin+Vth. On the other hand, we consider two drive transistors, one having the large threshold voltage Vth and another having the small threshold voltage Vth.

The former drive transistor having the large threshold voltage Vth has, as a result, the large gate-to-source voltage. In contrast, the drive transistor having the small threshold voltage Vth has, as a result, the small gate-to-source voltage. Therefore, as far as the threshold voltage Vth is concerned, if the variation in the same voltage Vth is cancelled by the correction operation, the same drain current Ids will flow through the two drive transistors for the same data potential Vin.

During the threshold correction period (VTC), it is necessary to ensure that the drain current Ids is wholly consumed for it to flow into one of the electrodes of the holding capacitor Cs, i.e., one of the electrodes of the capacitance Coled. of the organic light-emitting diode OLED so that the same diode OLED does not turn on. If the anode voltage of the same diode OLED is denoted by Voled., the threshold voltage thereof by Vth_oled., and the cathode voltage thereof by Vcath, the equation "Voled.<Vcath+Vth_oled." must always hold in order for the same diode OLED to remain off.

Assuming here that the cathode potential Vcath of the organic light-emitting diode OLED is constant at the low potential Vcc_L (e.g., ground voltage GND), the above equation can hold at all times if the light emission threshold voltage Vth_oled. is extremely large. However, the light emission threshold voltage Vth_oled. is determined by the manufacturing conditions of the organic light-emitting diode OLED. Further, the same voltage Vth_oled. cannot be increased excessively to achieve efficient light emission at low voltage. In the present embodiment, therefore, the organic light-emitting diode OLED is reverse-biased by setting the cathode potential Vcath larger than the low potential Vcc_L until the threshold correction period (VTC) ends.

The cathode potential Vcath adapted to reverse-bias the organic light-emitting diode OLED remains constant throughout the period shown in FIG. 4. It should be noted, however, that the cathode potential Vcath is set to a constant potential at which the reverse bias is cancelled by the threshold voltage correction. Therefore, the mobility correction and light emission processes continue with the reverse bias cancelled at times later than time T19 when the source potential is higher than during the threshold voltage correction. Then, the organic light-emitting diode OLED is reverse-biased again later during the light emission interruption period and light emission disabling process period.

[Writing and Mobility Correction Period (W&μ)]The writing and mobility correction period (W&μ) begins from time T19. At this time, the sampling transistor Ms is off, and the drive transistor Md in cutoff just as they are shown in FIG. 6B. The gate of the drive transistor Md is maintained at the reference data potential Vo. The source potential Vs is at Vo−Vth, and the gate-to-source voltage Vgs (voltage held by the holding capacitor Cs) at Vth.

Figure 7A:
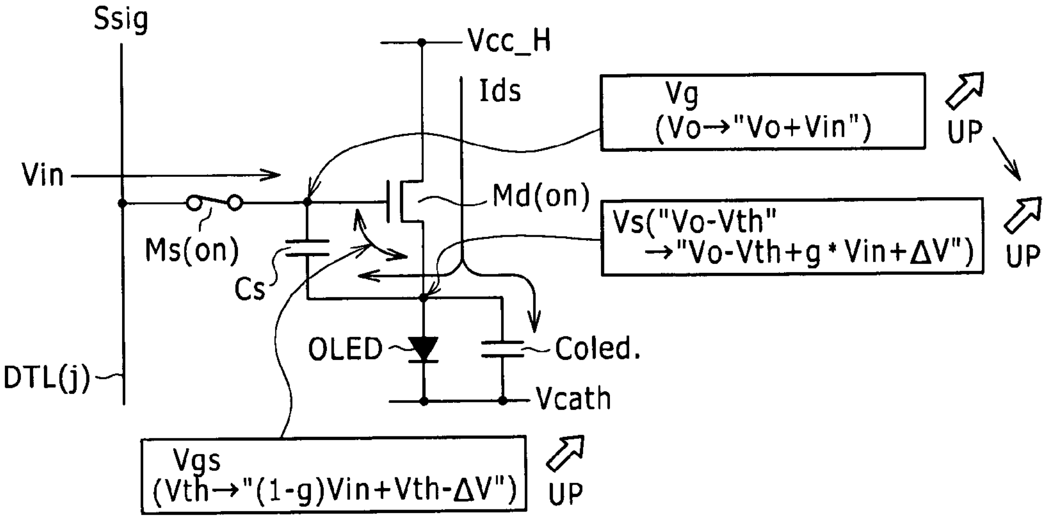
FIGS. 7A and 7B are explanatory diagrams of operation up to a light emission enabled period.

As illustrated in FIG. 4B, while the video signal pulse PP(1) is applied at time T19, the write pulse WP is supplied to the gate of the sampling transistor Ms. This turns on the sampling transistor Ms as illustrated in FIG. 7A, causing the data voltage Vin to be supplied to the gate of the drive transistor Md. The data voltage Vin is the difference between the data potential Vsig (=Vin+Vo) and the gate potential Vg (=Vo). As a result, the gate potential Vg is equal to Vo+Vin.

When the gate potential Vg increases by the data voltage Vin, the source potential Vs will also increase together with the gate potential Vg. At this time, the data voltage Vin is not conveyed to the source potential Vs in an as-is manner. Instead, the source potential Vs increases by a rate of change ΔVs commensurate with a capacitance coupling ratio g, i.e., g*Vin. This is shown in equation [1] as follows.

$$\Delta Vs = Vin(=Vsig-Vo)\times Cs/(Cs+Coled.) \quad [1]$$

Here, the capacitance of the holding capacitor Cs is denoted by the same reference numeral Cs. Reference numeral Coled. is the equivalent capacitance of the organic light-emitting diode OLED.

From the above, the source potential Vs after the change is Vo−Vth+g*Vin if the mobility correction is not considered. As a result, the gate-to-source voltage Vgs of the drive transistor Md is (1−g)Vin+Vth.

A description will be given here of the variation in the mobility μ.

In the threshold voltage correction performed earlier, the drain current Ids contains, in fact, an error resulting from the mobility μ each time this current flows. However, this error component caused by the mobility μ was not discussed strictly because the variation in the threshold voltage Vth was large. At this time, a description was given simply by using "up" and "down" rather than the capacitance coupling ratio g to avoid complications of the description of the variation in the mobility.

On the other hand, the threshold voltage Vth is held by the holding capacitor Cs after the threshold voltage correction has been performed in a precise manner, as explained earlier. When the drive transistor Md is turned on later, the drain current Ids will remain unchanged irrespective of the magnitude of the threshold voltage Vth. Therefore, if the voltage held by the holding capacitor Cs (gate-to-source voltage Vgs) changes due to the drive current Id at the time of the conduction of the drive transistor Md after the threshold voltage correction, this change ΔV (positive or negative) reflects not only the variation in the mobility μ of the drive transistor Md, and more precisely, the mobility which, in a pure sense, is a physical parameter of the semiconductor material, but also the comprehensive variation in those factors affecting the current driving capability in terms of transistor structure or manufacturing process.

Going back to the description of the operation in consideration of the above, when the data voltage Vin is added to the gate potential Vg after the sampling transistor Ms has turned on in FIG. 7A, the drive transistor Md attempts to pass the drain current Ids, commensurate in magnitude with the data voltage Vin (gray level), from the drain to source. At this time, the drain current Ids varies according to the mobility μ. As a result, the source potential Vs is given by Vo−Vth+g*Vin+ΔV, which is the sum of Vo−Vth+g*Vin and the change ΔV resulting from the mobility μ.

At this time, in order for the organic light-emitting diode OLED not to emit light, it is only necessary to set the cathode potential Vcath in advance according, for example, to the data voltage Vin and capacitance coupling ratio g so that the equation Vs(=Vo−Vth+g*Vin+ΔV)<Vth_oled.+Vcath is satisfied.

Setting the cathode potential Vcath in advance as described above reverse-biases the organic light-emitting diode OLED, bringing the same diode OLED into a high impedance state. As a result, the organic light-emitting diode OLED exhibits a simple capacitance characteristic rather than diode characteristic.

At this time, so long as the equation Vs(=Vo−Vth+g*Vin+ΔV)<Vth_oled.+Vcath is satisfied, the source potential Vs will not exceed the sum of the light emission threshold voltage Vth_oled. and cathode potential Vcath of the organic light-emitting diode OLED. Therefore, the drain current Ids (drive current Id) is used to charge a combined capacitance C=Cs+Coled.+Cgs which is the sum of three capacitance values. These are the capacitance value of the holding capacitor Cs (denoted by the same reference numeral Cs), that of the equivalent capacitance of the organic light-emitting diode OLED (denoted by the same reference numeral Coled. as a parasitic capacitance) when the same diode OLED is reverse-biased and that of a parasitic capacitance (denoted by Cgs) existing between the gate and source of the drive transistor Md. This causes the source potential Vs of the drive transistor Md to rise. At this time, the threshold voltage correction operation of the drive transistor Md is already complete. Therefore, the drain current Ids flowing through the same transistor Md reflects the mobility μ.

As shown in the equation (1−g)Vin+Vth−ΔV in FIGS. 4D and 4E, as far as the gate-to-source voltage Vgs held by the holding capacitor Cs is concerned, the change ΔV added to the source potential Vs is subtracted from the gate-to-source voltage Vgs(=(1−g)Vin+Vth) after the threshold voltage correction. Therefore, the change ΔV is held by the holding capacitor Cs so that a negative feedback is applied. As a result, the change ΔV will also be hereinafter referred to as a "feedback amount."

The feedback amount ΔV can be expressed by the approximation equation ΔV=t*Ids/Coled. because the equation Coled. >>Cs+Cgs holds when the organic light-emitting diode OLED is reverse-biased. It is clear from this approximation equation that the change ΔV is a parameter which changes in proportion to the change of the drain current Ids.

From the approximation equation of the feedback amount ΔV, the same amount ΔV added to the source potential Vs is dependent upon the magnitude of the drain current Ids (this magnitude is positively related to the magnitude of the data voltage Vin, i.e., the gray level) and the period of time during which the drain current Ids flows, i.e., time (t) from time T19 to time T1A required for the mobility correction. That is, the larger the gray level and the longer the time (t), the larger the feedback amount ΔV.

Therefore, the mobility correction time (t) need not always be constant. In contrast, it may be more appropriate to adjust the mobility correction time (t) according to the drain current Ids (gray level). For example, when the gray level is almost white with the drain current Ids being large, the mobility correction time (t) should be short. In contrast, when the gray level is almost black with the drain current Ids being small, the mobility correction time (t) should be long. This automatic adjustment of the mobility correction time according to the gray level can be implemented by providing the write signal scan circuit 42, for example, with this functionality in advance.

[Light Emission Enabled Period (LM1)]

When the writing and mobility correction period (W&μ) ends at time T1A, the light emission enabled period (LM1) begins.

The write pulse WP ends at time T1A, turning off the sampling transistor Ms and causing the gate of the drive transistor Md to float. At time T1A and beyond, the drive transistor Md initiates the automatic setting of the light emission enabling bias. The period of time during which the automatic setting continues is also included in an application time of the light emission enabling bias.

Incidentally, in the writing and mobility correction period (W&μ) prior to the light emission enabled period (LM1), the drive transistor Md may not always be able to pass the drain current Ids commensurate with the data voltage Vin despite its attempt to do so. The reason for this is as follows. That is, the gate voltage Vg of the drive transistor Md is fixed at Vo+Vin if the current level (Id) flowing through the organic light-emitting diode OLED is considerably smaller than that (Ids) through the same transistor Md because the sampling transistor Ms is on. The source potential Vs attempts to converge to the potential (Vo+Vin−Vth) which is lower by the threshold voltage Vth from Vo+Vin. Therefore, no matter how long the mobility correction time (t) is extended, the source potential Vs will not exceed the above convergence point. The mobility should be corrected by monitoring the difference in the mobility μ based on the difference in time demanded for the convergence. Therefore, even if the data voltage Vin close to white that has the maximum brightness is supplied, the end point of the mobility correction time (t) is determined before the convergence is achieved.

When the gate of the drive transistor Md floats after the light emission enabled period (LM1) has begun, the source potential Vs of the same transistor Md is allowed to rise further because the convergence point or limiting factor is removed. Therefore, the drive transistor Md acts to pass the drive current Id commensurate with the supplied data voltage Vin.

Figure 7B:
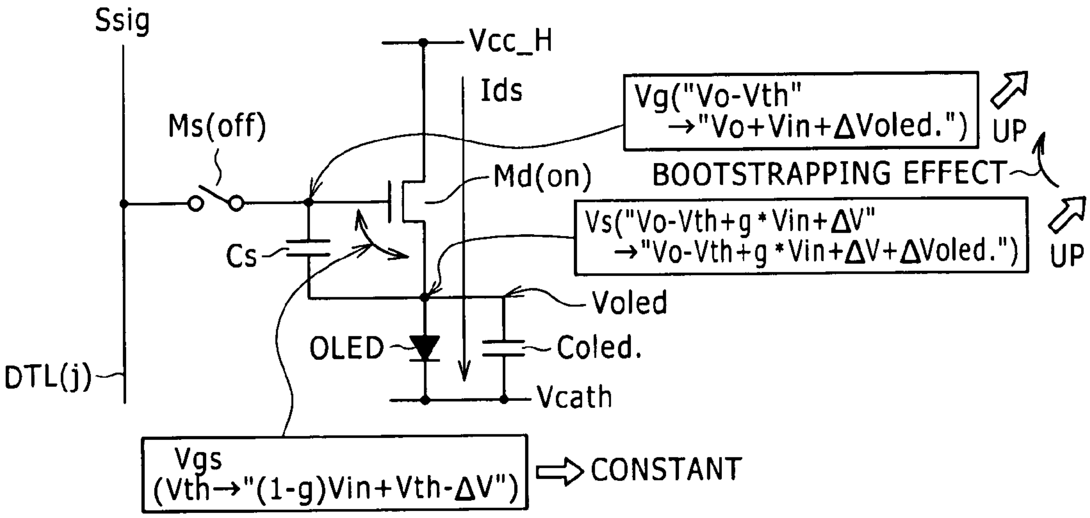

This causes the source potential Vs (anode potential of the organic light-emitting diode OLED) to rise. As a result, the drain current Ids begins to flow through the organic light-emitting diode OLED as illustrated in FIG. 7B, causing the same diode OLED to emit light. Shortly after the light emission begins, the drive transistor Md is saturated with the drain current Ids commensurate with the supplied data voltage Vin. When the same current Ids (=Id) is brought to a constant level, the organic light-emitting diode OLED will emit light at the brightness commensurate with the data voltage Vin.

The increase in the anode potential of the organic light-emitting diode OLED taking place from the beginning of the light emission enabled period (LM1) to when the brightness is brought to a constant level is none other than the increase in the source potential Vs of the drive transistor Md. This increase in the source potential Vs will be denoted by reference numeral ΔVoled. to represent the increment in the anode voltage Voled. of the organic light-emitting diode OLED. The source potential Vs of the drive transistor Md is brought to Vo−Vth+g*Vin+ΔV+ΔVoled (refer to FIG. 4E).

On the other hand, the gate potential Vg increases by the increment ΔVoled as does the source potential Vs as illustrated in FIG. 4D because the gate is floating. As the drain current Ids saturates, the source potential Vs will also saturate, causing the gate potential Vg to saturate.

As a result, the gate-to-source voltage Vgs (voltage held by the holding capacitor Cs) is maintained at the level during the mobility correction ((1−g)Vin+Vth−ΔV) throughout the light emission enabled period (LM1).

During the light emission enabled period (LM1), the drive transistor Md functions as a constant current source. As a result, the I-V characteristic of the organic light-emitting diode OLED may change over time, changing the source potential Vs of the drive transistor Md.

However, the voltage held by the holding capacitor Cs is maintained at $(1-g)Vin+Vth-\Delta V$, irrespective of whether the I-V characteristic of the organic light-emitting diode OLED changes. The voltage held by the holding capacitor Cs contains two components, (+Vth) adapted to correct the threshold voltage Vth of the drive transistor Md and ($-\Delta V$) adapted to correct the variation in the mobility μ. Therefore, even if there is a variation in the threshold voltage Vth or mobility μ between different pixels, the drain current Ids of the drive transistor Md, i.e., the drive current Id of the organic light-emitting diode OLED, will remain constant.

More specifically, the larger the threshold voltage Vth, the more the drive transistor Md reduces the source potential Vs using the threshold voltage correction component contained in the voltage held by the holding capacitor Cs. This is intended to increase the source-to-drain voltage so that the drain current Ids (drive current Id) flows in a larger amount. Therefore, the drain current Ids remains constant even in the event of a change in the threshold voltage Vth.

On the other hand, if the change ΔV is small because of the small mobility μ, the voltage held by the holding capacitor Cs will decline only to a small extent thanks to the mobility correction component ($-\Delta V$) contained therein. This provides a relatively large source-to-drain voltage. As a result, the drive transistor Md operates in such a manner as to pass the drain current Ids (drive current Id) in a larger amount. Therefore, the drain current Ids remains constant even in the event of a change in the mobility μ.

Figure 8A:
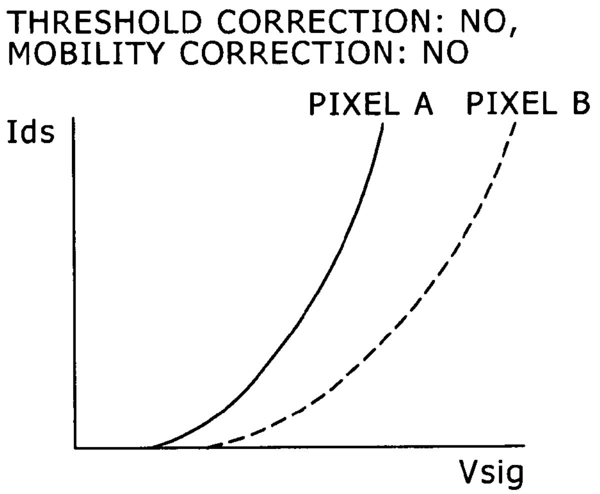
FIGS. 8A to 8C are explanatory diagrams of the effects of corrections.
Figure 8B:
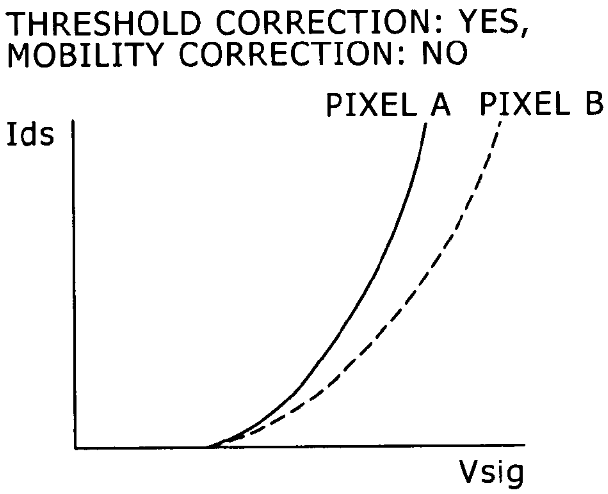
Figure 8C:
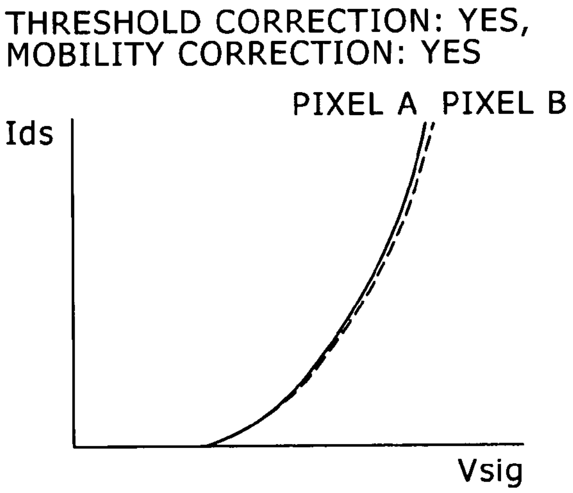

FIGS. 8A to 8C diagrammatically illustrate the change in relationship between the magnitude of the data potential Vsig and the drain current Ids (I/O characteristic of the drive transistor Md) in three different conditions A, B and C. The condition A is an initial condition in which neither the threshold voltage correction nor the mobility correction have been performed. In the condition B, only the threshold voltage correction has been performed. In the condition C, both the threshold voltage correction and the mobility correction have been performed.

It is clear from FIG. 8 that the characteristic curves of pixels A and B, initially far apart from each other, are brought very close to each other first by the threshold voltage correction and then infinitely close to each other by the mobility correction to such an extent that the two curves seem nearly identical.

It has been found from the above that the light emission brightness of the organic light-emitting diode OLED remains constant even in the event of a variation in the threshold voltage Vth or mobility μ of the drive transistor Md between the different pixels and also in the event of a secular change of the characteristics of the same transistor Md so long as the data voltage Vin remains unchanged.

A description will be given here of the light emission interruption period (NOT-LM). A description will be given first of the need to control the light emission time of the organic light-emitting diode OLED. A description will be given next of the detrimental effects of controlling the light emission enabled period by means of the length of the light emission disabling process period (LM-STOP) rather than the light emission interruption period (NOT-LM).

[Controlling the Light Emission Enabled Period]

If the light emission enabled period is controlled by means of the length of the light emission disabling process period (LM-STOP), the so-called "flashing phenomenon," which will be described below, will occur because the length of the same period (LM-STOP) may be changed depending on the specification of the system (equipment) incorporating the organic EL display 1.

Figures 9A, 9B:
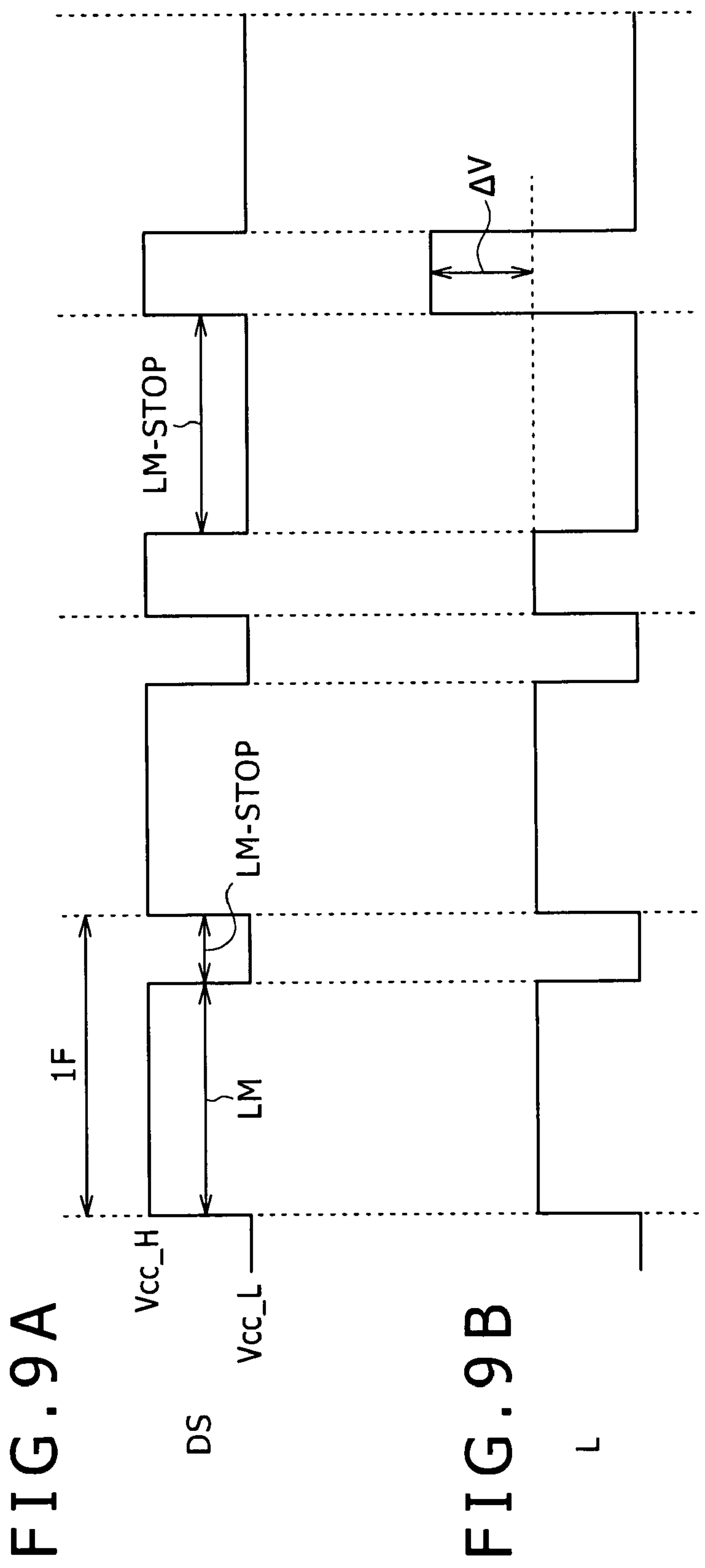
FIGS. 9A and 9B are timing diagrams illustrating a signal waveform and change in light emission intensity for the description of a flashing phenomenon.

FIGS. 9A and 9B are diagrams used to describe the causes of the flashing phenomenon.

FIG. 9A illustrates the waveform of the power drive pulse DS over a period of four fields (4F). The waveform thereof over about one field (1F) is shown in FIG. 4C.

In FIG. 4 described earlier, the threshold voltage correction period (VTC) and writing and mobility correction period (W&μ) are very short as compared to the light emission enabled periods (LM0 and LM1). In FIG. 9A, therefore, the threshold voltage correction period (VTC) and writing and mobility correction period (W&μ) are not shown. The 1F period begins with a light emission enabled period (LM). Here, the light emission enabled period (LM) is a period of time during which the power drive pulse DS is at the high potential Vcc_H. The subsequent period of time during which the power drive pulse DS is at the low potential Vcc_L corresponds to the light emission disabling process period (LM-STOP).

FIG. 9B diagrammatically illustrates light emission intensity L which changes in synchronism with FIG. 9A. A case is shown here in which the data voltage Vin is continuously displayed in the same pixel row over a period of four fields.

As illustrated in FIG. 9A, the light emission disabling process period (LM-STOP) is relatively short in the first two-field period. In the subsequent two-field period, however, the light emission disabling process period (LM-STOP) is relatively long. This control is provided to address, for example, the relocation of the equipment from outdoors to indoors. In response, the CPU or other control circuit (not shown) incorporated in the equipment determines that the surrounding environment has become darker. As a result, the CPU or other control circuit may bring down the display brightness as a whole for improved ease of viewing. A similar process may be used when the equipment goes into low power consumption mode. On the other hand, the CPU or other control circuit may maintain the drive current constant to ensure longer service life of the organic light-emitting diode OLED. For example, if the data voltage Vin is large, the drive current is maintained constant to prevent excessive increase in this current, thus extending the light emission enabled period (LM) and providing the light emission brightness commensurate with the data voltage Vin. In the opposite case, i.e., if the drive current is large as illustrated, the light emission enabled period (LM) may be reduced with the drive current maintained constant, thus providing predetermined light emission brightness commensurate with the reduced data voltage Vin.

The period of time during which the organic light-emitting diode OLED is reverse-biased is determined by the length of the light emission disabling process period (LM-STOP). Therefore, if the length of the light emission enabled period (LM) changes halfway through the display, the period of time during which the organic light-emitting diode OLED is actually reverse-biased will also change.

It takes time for the capacitance Coled. of the organic light-emitting diode OLED, shown, for example, in FIG. 5A, to stabilize after a reverse bias is applied to the same diode OLED. This time is longer than the 1F period. In addition, the capacitance value thereof changes slowly. As a result, the longer the reverse-biasing period, the larger the capacitance Coled. From Equation 1 described earlier, therefore, the larger the capacitance Coled., the smaller the change ΔV of the source potential Vs. As a result, the gate-to-source voltage Vgs of the drive transistor Md becomes larger than in the preceding field during which the same data voltage Vin is supplied. If the same voltage Vgs becomes larger between fields, the light emission intensity L increases by ΔL starting from the display of the succeeding field as illustrated in FIG. 9B, thus resulting in a flashing phenomenon in which the entire screen becomes instantaneously bright.

In contrast, if the light emission disabling process period (LM-STOP) becomes suddenly shorter, the reverse-biasing period will be shorter. For the reason opposite to that described above, therefore, the gate-to-source voltage Vgs becomes suddenly small. This brings down the light emission intensity L, causing the entire screen to become instantaneously dark (type of flashing phenomenon).

To prevent the above flashing phenomenon, the display control according to the present embodiment shown in FIG. 4 fixes the length of the light emission disabling process period (LM-STOP) which may change according to the system demands and inserts the light emission interruption period (NOT-LM) halfway into the light emission enabled period (LM1). The length of the light emission interruption period (NOT-LM) is controlled so as to accommodate the change in length of the light emission enabled period.

[Light Emission Interruption Period (NOT-LM)]

The power drive pulse DS, for example, is pulled down from the high potential Vcc_H to the low potential Vcc_L halfway through the light emission enabled period (LM1) in which the application of a light emission enabling bias begins from time T1A, i.e., at time T1Ba as illustrated in FIG. 4C. This stops the application of the source-to-drain voltage to the drive transistor Md which has been driven up to that point by the drain current Ids commensurate with the data voltage Vin. The charge of the source is discharged in the same manner as shown in FIG. 5B. As a result, the source potential Vs declines rapidly toward the low potential Vcc_L as illustrated in FIG. 4E. Because the gate of the drive transistor Md is floating, the gate potential Vg will also decline with the decline of the source potential Vs (FIG. 4D).

This reverse-biases the organic light-emitting diode OLED, causing the same diode OLED to stop emitting light.

After the elapse of a predetermined time, the potential of the power drive pulse DS, shown in FIG. 4C, is switched back up to the high potential Vcc_H. Because the gate of the drive transistor Md remains floating during the light emission enabled period, the gate-to-source voltage Vgs (=voltage held by the holding capacitor Cs) remains constant. Therefore, even if the potential of the power drive pulse DS is pulled back up to the high potential Vcc_H, the source potential Vs is switched back to the level commensurate with the data voltage Vin prior to the interruption of the light emission, with the held voltage maintained constant. As a result, the gate potential Vg will also be switched back to the initial level. The organic light-emitting diode OLED resumes its light emission from a certain level in the course of the above transition of the potentials.

Then, the aforementioned light emission disabling process period (LM-STOP) begins at time T1C, stopping the light emission of the organic light-emitting diode OLED, initializing the voltage held by the holding capacitor Cs and terminating the field F(1).

Of the light emission enabled period (LM1), the sum of light emission enabled periods (LM1-1) and (LM1-2), not including the light emission interruption period (NOT-LM), roughly corresponds to the effective light emission time. Therefore, the effective length of the light emission time can be changed by controlling the length of the light emission interruption period (NOT-LM).

At this time, the light emission disabling process period (LM-STOP), which also serves as a period adapted to initialize the voltage held by the holding capacitor Cs prior to the correction, remains constant at all times. As a result, the reverse biasing period which can affect the light emission intensity L remains always constant, effectively preventing the flashing phenomenon.

<<Second Embodiment>>

Figures 10A, 10B, 10C:
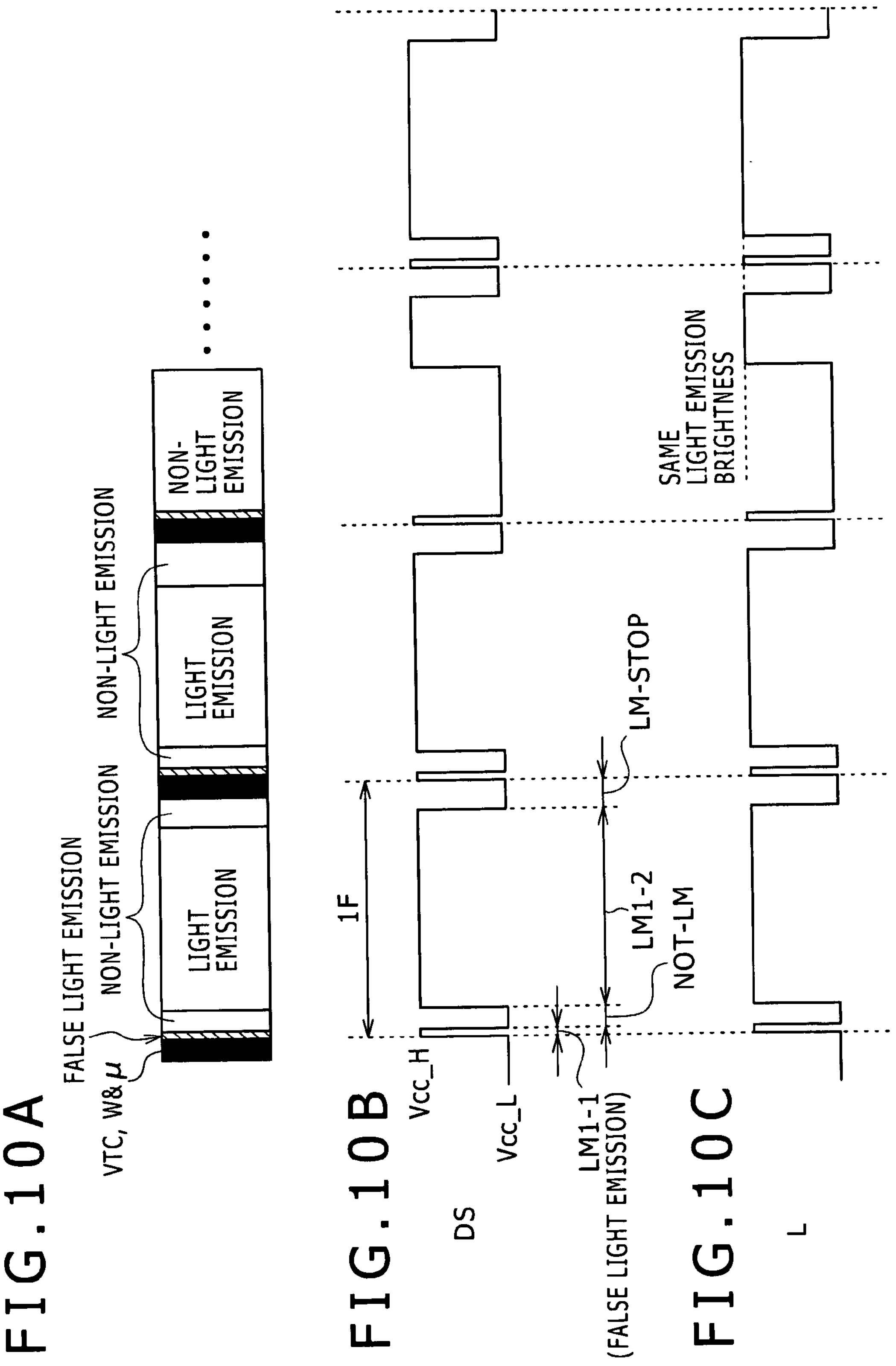
FIGS. 10A to 10C are timing diagrams illustrating a signal waveform, light emission intensity and so on according to a second embodiment.

FIG. 10A diagrammatically illustrates the light emission interruption timings according to the second embodiment. FIG. 10B is a waveform diagram of the power drive pulse DS having a time axis synchronous with the light emission interruption timings shown in FIG. 10A. FIG. 10C diagrammatically illustrates the change in the light emission intensity L along a similar time axis.

In the second embodiment, a light emission enabling bias is applied. However, a brief light emission (false light emission) by which the organic light-emitting diode OLED cannot emit light is placed at the beginning of the one-field (1F) period for use as the light emission enabled period (LM1-1) shown in FIG. 4. Next, the processes for the light emission interruption period (NOT-LM) and light emission enabled period (LM1-2) are performed, followed by the reverse-biasing of the organic light-emitting diode OLED to stop its light emission and the initialization of the voltage held by the holding capacitor Cs in the light emission disabling process period (LM-STOP).

Here, if a reverse bias cancelling potential is exceeded before a light emission potential is reached in the process of increase in the source potential Vs and gate potential Vg after the light emission enabled period begins, this is defined as the false light emission.

<<Third Embodiment>>

Figures 11A, 11B, 11C:
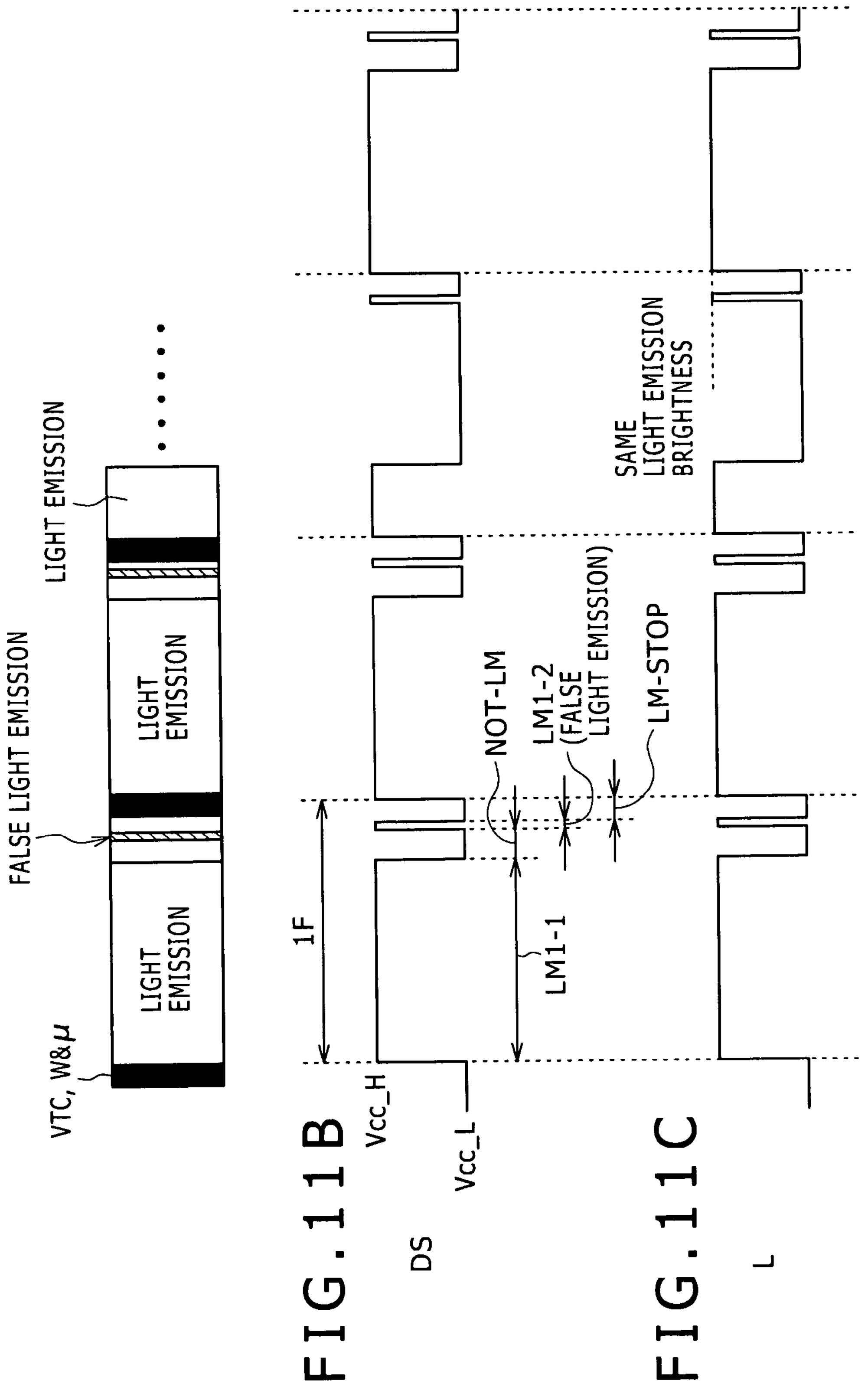
FIGS. 11A to 11C are timing diagrams illustrating a signal waveform, light emission intensity and so on according to a third embodiment.

FIG. 11A diagrammatically illustrates the light emission interruption timings according to the third embodiment. FIG. 11B is a waveform diagram of the power drive pulse DS having a time axis synchronous with the light emission interruption timings shown in FIG. 11A. FIG. 11C diagrammatically illustrates the change in the light emission intensity L along a similar time axis.

In the third embodiment, the false light emission defined above is placed before the light emission disabling process period (LM-STOP), which is the last process period of the one-field (1F) period, for use as the light emission enabled period (LM1-2) shown in FIG. 4.

That is, when the one-field (1F) period begins, the process for the light emission enabled period (LM1-1), whose length substantially determines the light emission time, is performed. Next, the processes for the light emission interruption period (NOT-LM) and light emission enabled period (LM1-2), i.e., a false light emission period, are performed, followed by the reverse-biasing of the organic light-emitting diode OLED to stop its light emission and the initialization of the voltage held by the holding capacitor Cs in the light emission disabling process period (LM-STOP).

<<Fourth Embodiment>>

In the fourth embodiment, a light emission enabled period, long enough for the organic light-emitting diode OLED to actually emit light, is provided to replace the false light emission period provided in the second and third embodiments. The timing at which the light emission enabled period is provided can be readily deduced from analogy. Therefore, a description will be given next of a flicker prevention measure. This measure consists of repeating the light emission and non-light emission a plurality of times within the light emission enabled period (LM1).

Figures 12A, 12B, 12C:
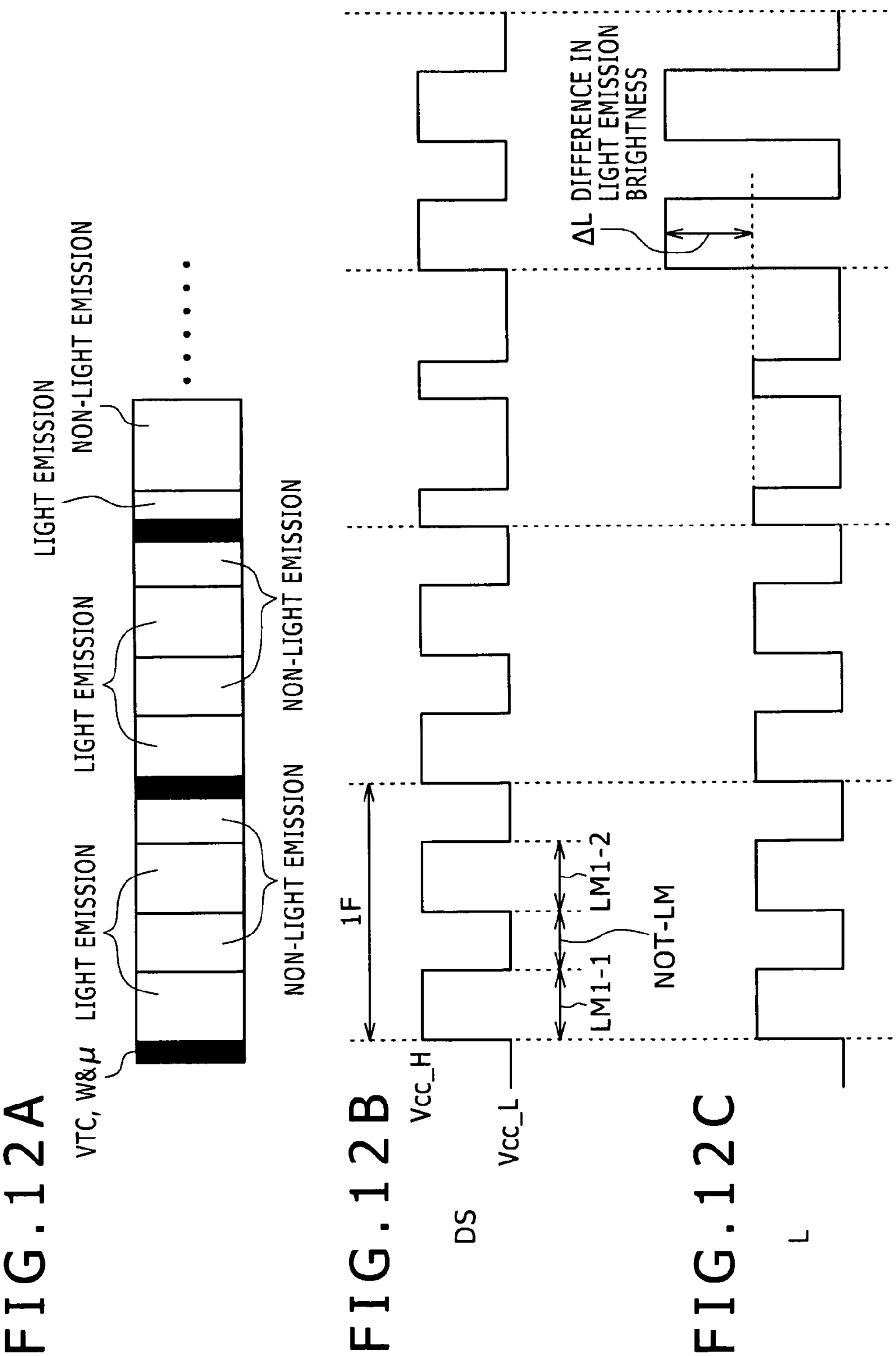
FIGS. 12A to 12C are timing diagrams illustrating a flicker prevention measure according to a fourth embodiment.
Figures 13A, 13B:
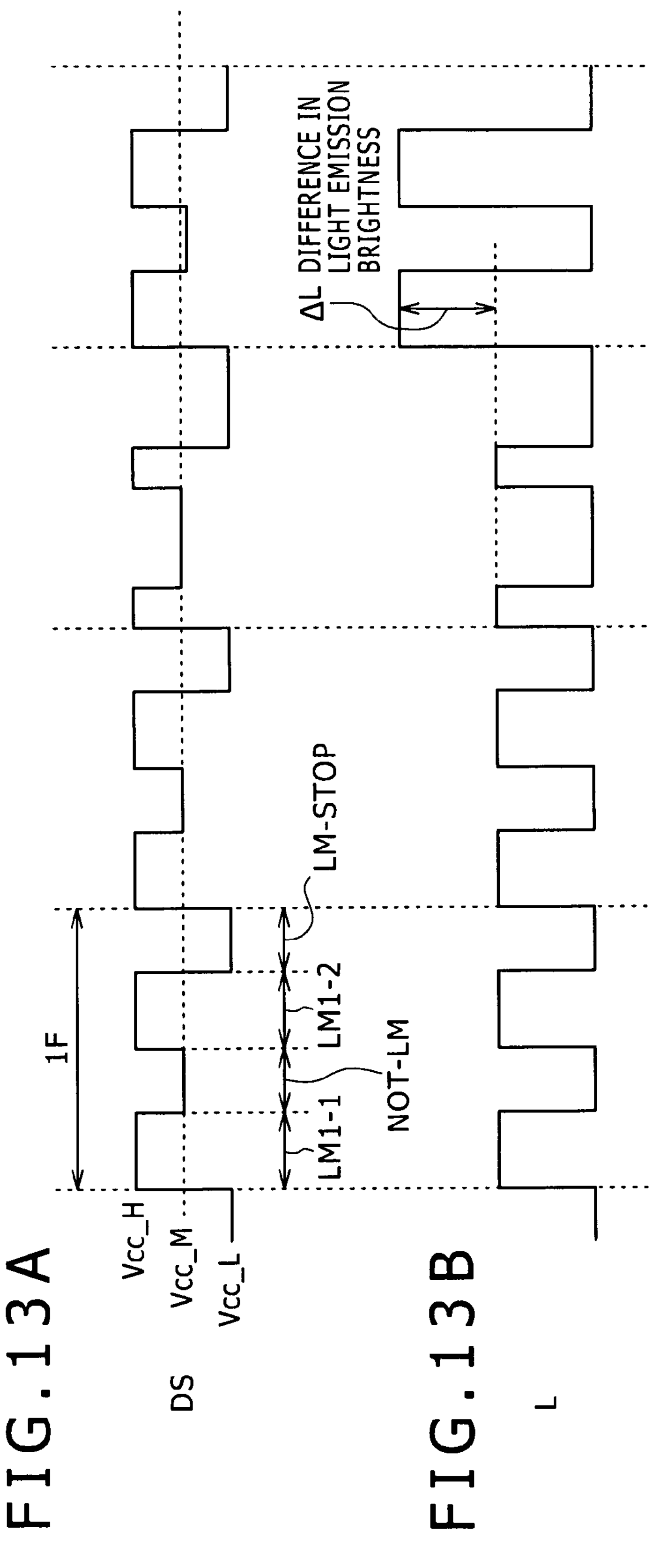
FIGS. 13A and 13B are timing diagrams of signal waveforms according to the fourth embodiment.

FIGS. 12A and 12B illustrate the timings at which two light emission enabled periods are provided per field as a flicker prevention measure and an example of change in potential of the power drive pulse DS. FIG. 12C illustrates that a difference in the light emission brightness is produced by the length of the light emission interruption period of a previous field. FIG. 13A illustrates, for the aforementioned pixel circuit, the timings at which two light emission enabled periods are provided per field as a flicker prevention measure and an example of change in potential of the power drive pulse DS.

During the light emission interruption period between the two light emission enabled periods within one field, the power drive pulse DS is at a potential Vcc_M which is a predetermined potential between the low potential Vcc_L and high potential Vcc_H. This shuts off the current flowing through the organic light-emitting diode OLED. It should be noted, however, as shown in FIG. 13B, that a difference in the light emission brightness is produced by the length of the light emission interruption period of a previous field even when such timings is used.

Figures 14A, 14B, 14C:
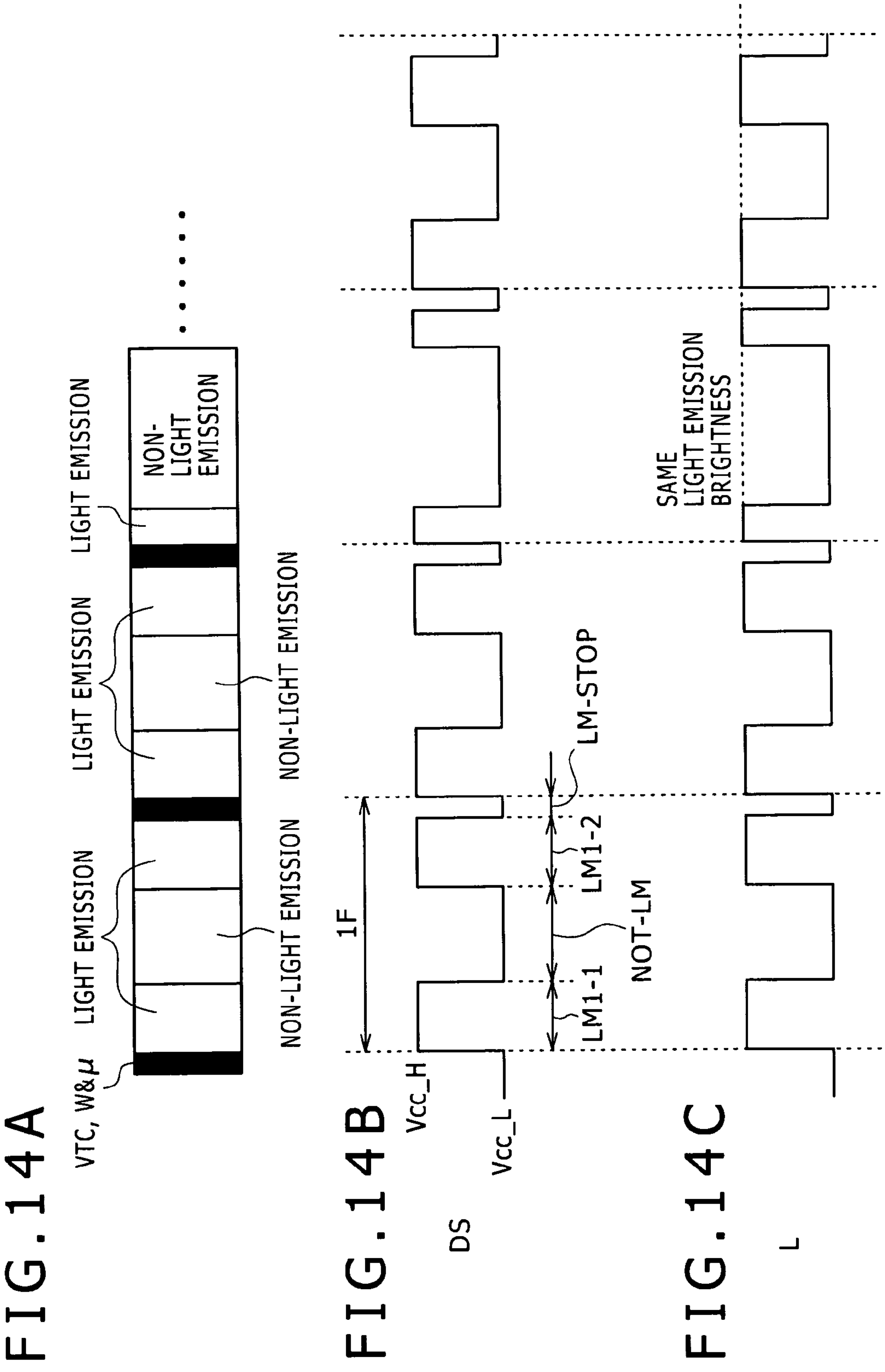
FIGS. 14A, 14B and 14C are other timing diagrams according to the fourth embodiment.

Therefore, the present embodiment maintains the light emission disabling process period (reverse bias application period) prior to the threshold voltage correction by adjusting the light emission interruption period between the two light emission enabled periods every field as illustrated in FIGS. 14A and 14B. This provides a constant change in the capacitance Coled. of the organic light-emitting diode OLED at all times, thus making it possible to determine the light emission brightness in the sampling period (mobility correction period) adapted to determine the light emission brightness without being affected by the length of the light emission enabled period in the preceding field as shown in FIG. 14C.

Several modification examples of the present embodiment will be described below.

MODIFICATION EXAMPLE 1

The pixel circuit is not limited to that illustrated in FIG. 2.

In the pixel circuit illustrated in FIG. 2, the reference data potential Vo is supplied as a result of the sampling of the video signal Ssig. However, the same signal Ssig may be supplied to the source or gate of the drive transistor Md via another transistor.

The pixel circuit illustrated in FIG. 2 has only one capacitor, i.e., the holding capacitor Cs. However, another capacitor may be provided, for example, between the drain and gate of the drive transistor Md.

MODIFICATION EXAMPLE 2

There are two driving methods in which the pixel circuit controls the light emission and non-light emission of the organic light-emitting diode OLED, i.e., controlling the transistor in the pixel circuit by means of the scan line and driving the supply line of the supply voltage by AC power using a drive circuit (AC driving of the power supply).

The pixel circuit illustrated in FIG. 2 is an example of the latter or AC driving of the power supply. In this driving method, however, the cathode of the organic light-emitting diode OLED may be driven by AC power to control whether to pass the drive current.

In the former control method of controlling the light emission by means of the scan line, on the other hand, another transistor is inserted between the drain or source of the drive transistor Md and the organic light-emitting diode OLED so as to drive the gate of the same transistor Md by means of the scan line whose driving is controlled by the power supply.

MODIFICATION EXAMPLE 3

The display control illustrated in FIG. 4 completes the threshold voltage correction period (VTC) in a single step. However, the threshold voltage correction may be completed in a plurality of continuous steps (meaning that there is no initialization therebetween).

The first to fourth embodiments of the present invention provide the same brightness for all fields so long as the same data voltage is supplied, effectively preventing the so-called flashing phenomenon. These embodiments do so even in the event of a change in the light emission enabled period between different fields without being affected by the change in the bias applied to the organic light-emitting diode which takes place during a non-light emission enabled period (light emission disabled period) because of the length of the reverse bias application period.

It should be understood by those skilled in the art that various modifications, combinations, sub-combinations and alterations may occur depending on design requirements and other factors insofar as they are within the scope of the appended claims or the equivalents thereof.

What is claimed is:

1. A self-luminous display device comprising:
pixel circuits; and
a drive circuit, wherein
each of the pixel circuits includes
a light-emitting diode,
a drive transistor connected to a drive current channel of the light-emitting diode, and
a holding capacitor coupled to a control node of the drive transistor,
the drive circuit is configured to apply a light emission enabling bias to the light-emitting diode after correcting the drive transistor and writing a data voltage to the holding capacitor,
the drive circuit is configured to provide, during a light emission enabled period in which the light emission enabling bias is applied, a light emission interruption period adapted to change the light emission enabling bias to a non-light emission bias with the data voltage held by the holding capacitor, and
the drive circuit is configured to provide a light emission disabled period, by causing a reverse-bias of the light-emitting diode to stop light emission, for a constant period after the light emission enabled period.

2. The self-luminous display device of claim 1, wherein
the data voltage held by the holding capacitor is initialized during a light emission disabled period in which the light emission disabling process is performed.

3. The self-luminous display device of claim 1, wherein
correcting the drive transistor comprises a mobility correction, and the mobility correction is performed together with the writing of the data voltage to the control node.

4. The self-luminous display device of claim 1, wherein
a period of time from the beginning of the correction of the drive transistor to the end of the light emission disabled period is a constant screen display period, and
the drive circuit controls the length of the light emission enabled period during which the light-emitting diode actually emits light by changing the length of the light emission interruption period.

5. The self-luminous display device of claim 1, wherein the drive circuit is configured to stop the light emission of the light-emitting diode by reverse-biasing the same diode during the light emission interruption period and light emission disabled period in which the light emission disabling process is performed.

6. The self-luminous display device of claim 1, wherein the drive circuit is configured to perform a false light emission, in which light cannot substantially be emitted although the light emission enabling bias is applied to the light-emitting diode, for a predetermined period at the beginning of the light emission enabled period, and the drive circuit is configured to change the light emission enabling bias to the non-light emission bias when the light emission interruption period begins after the false light emission and changes the non-light emission bias back to the light emission enabling bias after elapse of a predetermined period.

7. The self-luminous display device of claim 1, wherein the drive circuit is configured to perform a false light emission, in which light cannot substantially be emitted although the light emission enabling bias is applied to the light-emitting diode, for a predetermined period at the end of the light emission enabled period, and the drive circuit is configured to change the light emission enabling bias to the non-light emission bias and initializes the held voltage when the light emission disabling process begins after the false light emission.

8. The self-luminous display device of claim 1, wherein the drive circuit is configured to repeat a light emission enabled period, long enough for the light-emitting diode to be able to actually emit light, and the light emission interruption period a predetermined number of times during the light emission enabled period.

9. A driving method of a self-luminous display device, the self-luminous display device including pixel circuits, each of the pixel circuits including a light-emitting diode, a drive transistor connected to a drive current channel of the light-emitting diode, and a holding capacitor coupled to a control node of the drive transistor, the driving method comprising the steps of:

stopping a light emission of the light-emitting diode by reverse-biasing the light-emitting diode for a constant period;

correcting the driving transistor and writing a data voltage to the holding capacitor;

applying a light emission enabling bias to the light-emitting diode according to the written data voltage during a light emission enabled period; and temporarily changing the light emission enabling bias to a non-light emission bias with the data voltage held by the holding capacitor during the light emission enabled period.

10. The driving method of a self-luminous display device of claim 9, wherein said stopping the light emission comprises preventing the light emission of the light-emitting diode by reverse-biasing the light-emitting diode and initializing the voltage held by the holding capacitor.

11. The driving method of a self-luminous display device of claim 9, further comprising:

controlling a light emission interruption period after said temporarily changing the light emission enabling bias to the non-light emission bias, and recovering the light emission enabling bias, during the light emission enabled period, and providing a constant screen display period.

* * * * *